United States Patent
Thaulad et al.

(10) Patent No.: US 11,581,214 B2
(45) Date of Patent: *Feb. 14, 2023

(54) ENHANCED AUTOMATIC WAFER CENTERING SYSTEM AND TECHNIQUES FOR SAME

(71) Applicant: Lam Research Corporation, Fremont, CA (US)

(72) Inventors: Peter S. Thaulad, San Jose, CA (US); Brett M. Herzig, San Jose, CA (US); Richard M. Blank, San Jose, CA (US); Benjamin Wayne Mooring, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/309,180

(22) PCT Filed: Oct. 31, 2019

(86) PCT No.: PCT/US2019/059261
§ 371 (c)(1),
(2) Date: May 3, 2021

(87) PCT Pub. No.: WO2020/096846
PCT Pub. Date: May 14, 2020

(65) Prior Publication Data
US 2022/0028714 A1 Jan. 27, 2022

Related U.S. Application Data

(63) Continuation of application No. 16/180,691, filed on Nov. 5, 2018, now Pat. No. 10,796,940.

(51) Int. Cl.
*H01L 21/677* (2006.01)
*H01L 21/687* (2006.01)
(Continued)

(52) U.S. Cl.
CPC .. *H01L 21/68707* (2013.01); *H01L 21/67265* (2013.01); *H01L 21/67706* (2013.01);
(Continued)

(58) Field of Classification Search
CPC ......... H01L 21/67265; H01L 21/67766; H01L 21/67778; H01L 21/67781; H01L 21/681
See application file for complete search history.

(56) References Cited

U.S. PATENT DOCUMENTS 5,001,327 A 3/1991 Hirasawa et al.
5,483,138 A 1/1996 Shmookler et al.
(Continued)

FOREIGN PATENT DOCUMENTS

EP 0288233 A2 10/1988
EP 1925577 A1 5/2008
(Continued)

OTHER PUBLICATIONS

Co-pending U.S. Appl. No. 17/629,752, filed Jan. 24, 2022.
(Continued)

*Primary Examiner* — Gerald McClain
(74) *Attorney, Agent, or Firm* — Weaver Austin Villeneuve & Sampson LLP

(57) ABSTRACT

Systems and techniques for determining and correcting inter-wafer misalignments in a stack of wafers transported by a wafer handling robot. An enhanced automatic wafer centering system is provided that may be used to determine a smallest circle associated with the stack of wafers, which may then be used to determine whether or not the stack of wafer meets various process requirements and/or if a centering correction can be made to better align the wafers with a receiving station coordinate frame.

32 Claims, 19 Drawing Sheets

(51) Int. Cl.
   *H01L 21/68* (2006.01)
   *H01L 21/67* (2006.01)
(52) U.S. Cl.
   CPC .. *H01L 21/67766* (2013.01); *H01L 21/67778* (2013.01); *H01L 21/67781* (2013.01); *H01L 21/68* (2013.01); *H01L 21/681* (2013.01); *H01L 21/68785* (2013.01)

(56) References Cited

U.S. PATENT DOCUMENTS

| | | | |
|---|---|---|---|
| 5,563,798 | A | 10/1996 | Berken et al. |
| 5,564,889 | A | 10/1996 | Araki |
| 5,706,201 | A | 1/1998 | Andrews |
| 5,855,465 | A | 1/1999 | Boitnott et al. |
| 5,855,681 | A | 1/1999 | Maydan et al. |
| 6,198,976 | B1 | 3/2001 | Sundar et al. |
| 6,315,512 | B1 | 11/2001 | Tabrizi et al. |
| 6,315,878 | B1 | 11/2001 | Patadia et al. |
| 6,405,101 | B1* | 6/2002 | Johanson ............. H01L 21/681 356/73 |
| 6,430,468 | B1 | 8/2002 | Tepman et al. |
| 6,508,883 | B1 | 1/2003 | Tanguay |
| 6,568,552 | B1 | 5/2003 | Tabrizi et al. |
| 6,610,150 | B1 | 8/2003 | Savage et al. |
| 6,760,976 | B1 | 7/2004 | Martinson et al. |
| 7,008,802 | B2 | 3/2006 | Lu |
| 7,357,842 | B2 | 4/2008 | Ishikawa et al. |
| 7,658,586 | B2 | 2/2010 | Niewmierzycki et al. |
| 7,694,647 | B2 | 4/2010 | Ishikawa et al. |
| 7,743,728 | B2 | 6/2010 | Ishikawa et al. |
| 7,925,377 | B2 | 4/2011 | Ishikawa et al. |
| 7,933,665 | B2* | 4/2011 | Sakiya .................. H01L 21/681 700/121 |
| 8,060,252 | B2 | 11/2011 | Gage et al. |
| 8,225,683 | B2 | 7/2012 | Bailey, III |
| 8,293,071 | B2 | 10/2012 | Lee |
| 8,489,237 | B2 | 7/2013 | Gage et al. |
| 9,002,514 | B2 | 4/2015 | Genetti et al. |
| 9,892,956 | B1 | 2/2018 | Konkola et al. |
| 9,960,068 | B1 | 5/2018 | Konkola et al. |
| 10,109,517 | B1 | 10/2018 | Blank et al. |
| 10,796,940 | B2 | 10/2020 | Thaulad et al. |
| 2001/0020199 | A1 | 9/2001 | Bacchi et al. |
| 2002/0053509 | A1 | 5/2002 | Hanson et al. |
| 2002/0098072 | A1 | 7/2002 | Sundar |
| 2003/0202865 | A1 | 10/2003 | Ponnekanti et al. |
| 2004/0067127 | A1 | 4/2004 | Hofmeister et al. |
| 2004/0151574 | A1 | 8/2004 | Lu |
| 2005/0137751 | A1 | 6/2005 | Cox et al. |
| 2005/0220576 | A1 | 10/2005 | Kim et al. |
| 2005/0265814 | A1 | 12/2005 | Coady |
| 2006/0020367 | A1 | 1/2006 | Nangoy |
| 2006/0039781 | A1 | 2/2006 | Niewmierzycki et al. |
| 2006/0045664 | A1 | 3/2006 | Niewmierzycki et al. |
| 2006/0182538 | A1 | 8/2006 | Lee et al. |
| 2008/0152463 | A1 | 6/2008 | Chidambaram et al. |
| 2008/0319559 | A1 | 12/2008 | De Ridder et al. |
| 2009/0142163 | A1 | 6/2009 | Genetti et al. |
| 2009/0143911 | A1 | 6/2009 | Gage et al. |
| 2010/0228374 | A1 | 9/2010 | Pike |
| 2010/0278623 | A1 | 11/2010 | Blank et al. |
| 2012/0014773 | A1 | 1/2012 | Gage et al. |
| 2012/0022827 | A1 | 1/2012 | Hertgens et al. |
| 2012/0224945 | A1 | 9/2012 | Douki et al. |
| 2014/0271051 | A1 | 9/2014 | Hiroki |
| 2014/0365011 | A1 | 12/2014 | Hosek et al. |
| 2015/0114292 | A1 | 4/2015 | Haverkamp et al. |
| 2015/0249028 | A1 | 9/2015 | Genetti et al. |
| 2016/0126128 | A1 | 5/2016 | Bonora et al. |
| 2016/0358808 | A1 | 12/2016 | Madsen et al. |
| 2017/0004987 | A1 | 1/2017 | Fairbairn |
| 2017/0018446 | A1 | 1/2017 | Yin et al. |
| 2018/0158716 | A1 | 6/2018 | Konkola et al. |
| 2018/0211864 | A1 | 7/2018 | Nordin et al. |
| 2020/0144097 | A1 | 5/2020 | Thaulad et al. |
| 2022/0172967 | A1 | 6/2022 | Topping et al. |
| 2022/0254666 | A1 | 8/2022 | Sadeghi et al. |

FOREIGN PATENT DOCUMENTS

| | | | |
|---|---|---|---|
| JP | H10340940 | A | 12/1998 |
| JP | 3560823 | B2 | 9/2004 |
| KR | 20020095371 | A | 12/2002 |
| KR | 20050072621 | A | 7/2005 |
| KR | 20050092278 | A | 9/2005 |
| KR | 100595135 | B1 | 6/2006 |
| KR | 100676823 | B1 | 2/2007 |
| KR | 100701080 | B1 | 3/2007 |
| KR | 200436002 | Y1 | 4/2007 |
| KR | 20090045504 | A | 5/2009 |
| KR | 20160144727 | A | 12/2016 |

OTHER PUBLICATIONS

International Preliminary Report on Patentability dated Feb. 10, 2022 issued in Application No. PCT/US2020/070300.
International Preliminary Report on Patentability dated May 20, 2021 issued in Application No. PCT/US2019/059261.
International Preliminary Report on Patentability dated Oct. 14, 2021, in application No. PCT/US2020/025389.
International Search Report and Written Opinion dated Feb. 25, 2020 issued in Application No. PCT/US2019/059261.
International Search Report and Written Opinion dated Jul. 23, 2020 issued in Application No. PCT/US2020/025389.
International Search Report and Written Opinion dated Nov. 4, 2020 issued in Application No. PCT/US2020/070300.
US Ex Parte Quayle dated Apr. 17, 2020 issued in U.S. Appl. No. 16/180,691.
U.S. Notice of Allowance dated Jun. 29, 2020 issued in U.S. Appl. No. 16/180,691.
U.S. Appl. No. 17/593,791, inventors Topping et al., filed Sep. 24, 2021.
Chinese First Office Action, dated Dec. 2, 2011, issued in Application No. 200810178495.1.
Chinese Second Office Action, dated Nov. 26, 2012, issued in Application No. 200810178495.1.
Chinese Third Office Action, dated Mar. 11, 2013, issued in Application No. 200810178495.1.
Korean Final Office Action dated Jan. 27, 2016 issued in KR 10-2015-0082832.
Korean Office Action dated Mar. 11, 2015 issued in KR 10-2008-0119291.
Korean Office Action dated Sep. 22, 2015 issued in KR 10-2015-0082832.
U.S. Final Office Action, dated Dec. 23, 2011, issued in U.S. Appl. No. 11/998,857.
U.S. Notice of Allowance, dated Dec. 3, 2014, issued in U.S. Appl. No. 11/998,857.
U.S. Notice of Allowance, dated Jun. 29, 2016, issued in U.S. Appl. No. 14/636,558.
U.S. Notice of Allowance, dated Mar. 15, 2013, issued in U.S. Appl. No. 13/243,906.
U.S. Notice of Allowance, dated Sep. 19, 2011, issued in U.S. Appl. No. 11/998,858.
U.S. Notice of Allowance [Supplemental Notice of Allowability], dated Jan. 27, 2015, issued in U.S. Appl. No. 11/998,857.
U.S. Office Action, dated Apr. 15, 2011, issued in U.S. Appl. No. 11/998,858.
U.S. Office Action, dated Dec. 2, 2015, issued in U.S. Appl. No. 14/636,558.
U.S. Office Action, dated Jun. 24, 2011, issued in U.S. Appl. No. 11/998,857.
U.S. Office Action, dated Nov. 14, 2012, issued in U.S. Appl. No. 13/243,906.

* cited by examiner

Figure 15

Table 1

| Coordinate | X | Y |
|---|---|---|
| 1 | 60.0 | 143.4 |
| 2 | -132.0 | 80.2 |
| 3 | 142.0 | 64.1 |
| 4 | 142.0 | -63.8 |
| 5 | -132.0 | -85.2 |
| 6 | 60.0 | -144.9 |

Table 2

| Triplet Combination | $x_1$ | $y_1$ | $x_2$ | $y_2$ | $x_3$ | $y_3$ | $x_c$ | $y_c$ | r | Contains all points |
|---|---|---|---|---|---|---|---|---|---|---|
| 1,2,3 | 60.0 | 143.4 | -132.0 | 80.2 | 142.0 | 64.1 | 0.8 | 0.1 | 155.1 | No |
| 1,2,4 | 60.0 | 143.4 | -132.0 | 80.2 | 142.0 | 64.1 | 0.8 | 0.1 | 155.1 | No |
| 1,2,5 | 60.0 | 143.4 | -132.0 | 80.2 | -132.0 | -85.2 | 1.6 | -2.5 | 157.1 | Yes |
| 1,2,6 | 60.0 | 143.4 | -132.0 | 80.2 | 60.0 | -144.9 | 1.0 | -0.8 | 155.7 | No |
| 1,3,4 | 60.0 | 143.4 | 142.0 | 64.1 | 142.0 | -63.8 | 0.8 | 0.2 | 155.0 | No |
| 1,3,5 | 60.0 | 143.4 | 142.0 | 64.1 | -132.0 | -85.2 | -0.2 | -0.9 | 156.4 | Yes |
| 1,3,6 | 60.0 | 143.4 | 142.0 | 64.1 | 60.0 | -144.9 | -0.1 | -0.8 | 156.2 | No |
| 1,4,5 | 60.0 | 143.4 | 142.0 | -63.8 | -132.0 | -85.2 | -0.8 | -0.5 | 156.2 | No |
| 1,4,6 | 60.0 | 143.4 | 142.0 | -63.8 | 60.0 | -144.9 | -0.1 | -0.8 | 156.2 | No |
| 1,5,6 | 60.0 | 143.4 | -132.0 | -85.2 | 60.0 | -144.9 | -0.5 | -0.8 | 156.3 | No |
| 2,3,4 | -132.0 | 80.2 | 142.0 | 64.1 | 142.0 | -63.8 | 0.8 | 0.2 | 155.0 | No |
| 2,3,5 | -132.0 | 80.2 | 142.0 | 64.1 | -132.0 | -85.2 | 0.6 | -2.5 | 156.3 | No |
| 2,3,6 | -132.0 | 80.2 | 142.0 | 64.1 | 60.0 | -144.9 | 0.7 | -1.0 | 155.6 | No |
| 2,4,5 | -132.0 | 80.2 | 142.0 | -63.8 | -132.0 | -85.2 | 0.6 | -2.5 | 156.3 | No |
| 2,4,6 | -132.0 | 80.2 | 142.0 | -63.8 | 60.0 | -144.9 | 0.7 | -1.0 | 155.6 | No |
| 2,5,6 | -132.0 | 80.2 | -132.0 | -85.2 | 60.0 | -144.9 | -1.0 | -2.5 | 154.9 | No |
| 3,4,5 | 142.0 | 64.1 | 142.0 | -63.8 | -132.0 | -85.2 | -0.8 | 0.2 | 156.5 | No |
| 3,4,6 | 142.0 | 64.1 | 142.0 | -63.8 | 60.0 | -144.9 | -2.4 | 0.2 | 157.9 | Yes |
| 3,5,6 | 142.0 | 64.1 | -132.0 | -85.2 | 60.0 | -144.9 | -0.4 | -0.6 | 156.4 | Yes |
| 4,5,6 | 142.0 | -63.8 | -132.0 | -85.2 | 60.0 | -144.9 | -0.7 | -1.5 | 155.7 | No |

ENHANCED AUTOMATIC WAFER CENTERING SYSTEM AND TECHNIQUES FOR SAME

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes

BACKGROUND

Semiconductor processing tools typically use wafer-handling robots to move circular wafers (such wafers have a nominally circular shape but may have notches or flats at one or more locations to allow for rotational indexing to be done or rotational position to be determined) between stations or equipment in the semiconductor processing tool. Some wafer-handling robots are equipped with "blade" type end effectors that are designed to lift and support wafers from underneath, like a spatula. The wafers supported by such blade-type end effectors are typically held in place by friction and may be dislodged or shifted relative to the end effector through the application of sufficient lateral force to the wafer, e.g., such as may be exerted on the wafer due to collision with another object or through inertial effects. For example, if the end effector undergoes accelerations that result in the friction forces holding the wafer in place being overcome, then there may be slippage between the wafer and the end effector. Wafers may also occasionally be misplaced on an end effector, resulting in an initial "slippage" effect, e.g., with the wafer not being appropriately centered.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided for handling one or more wafers of a nominal diameter $D_1$. The apparatus may include a wafer handling robot configured to support the one or more wafers of nominal diameter $D_1$ when the one or more wafers of nominal diameter $D_1$ are placed thereupon, a first edge-detection system, and a controller that includes one or more processors and one or more memory devices. The one or more processors, the one or more memory devices, the wafer handling robot, and the first edge-detection system may be operably connected with each other, and the one or more memory devices may store computer-executable instructions for controlling the one or more processors to: a) obtain information regarding a first reference point of the wafer handling robot; b) determine that a first set of one or more wafers is supported by the wafer handling robot, the first set of one or more wafers defining a silhouette edge in a horizontal plane when viewed along a vertical axis; c) cause the first edge-detection system to obtain information indicative of first horizontal coordinates of at least five points along the silhouette edge of the first set of one or more wafers relative to the first reference point; d) determine, for the first set of one or more wafers, the smallest circle that, when viewed along a vertical axis, circumscribes the first horizontal coordinates of the at least five points determined in (c); e) determine, for the first set of one or more wafers, a first center deviation by determining information indicative of the length and direction of a first reference line segment extending from the center of the smallest circle for the first set of one or more wafers to the first reference point; f) determine a first slip amount for the first set of one or more wafers that is based on the difference between the diameter of the smallest circle and $D_1$; and g) determine whether the first slip amount for the first set of one or more wafers exceeds a first threshold amount.

In some implementation of the apparatus, the first edge-detection system may include three first through-beam optical sensors, and each first through-beam optical sensor may be: configured to emit a corresponding vertically oriented optical beam when activated, positioned such that the furthest horizontal distance between any of the optical beams, when the first through-beam optical sensors are activated, is less than $D_1$, and configured to register, when the first through-beam optical sensor is activated, when the optical beam emitted thereby intersects an edge of an object.

In some implementations of the apparatus, the first edge-detection system may include a machine-vision system and the machine-vision system may be configured to obtain the information indicative of the first horizontal coordinates of the at least five points along the silhouette edge of the first set of one or more wafers relative to the first reference point.

In some implementations of the apparatus, the first edge-detection system includes one or more of: a set of three or more direct through-beam optical sensors, a set of three or more reflective through-beam optical sensors, a machine vision measurement system, or a set of three or more capacitive sensors.

In some implementations of the apparatus, the wafer handling robot may include an end effector having N blades, the first set of one or more wafers may include N or fewer wafers, each blade may be configured to support one of the wafers of nominal diameter $D_1$, and N may be greater than 1.

In some implementations of the apparatus, the N blades may include a first set of N-1 blades that are fixed with respect to one another, the first set of N-1 blades may be configured to move as a unit relative to a portion of the wafer handling robot to which the first set of N-1 blades are attached, and the blade of the end effector that is not in the first set of N-1 blades may be configured to be movable relative to the portion of the wafer handling robot to which the first set of N-1 blades are attached independently of the first set of N-1 blades.

In some such implementations, N may equal 5.

In some implementations of the apparatus, the wafer handling robot may include an end effector having exactly one blade and the first set of one or more wafers may include exactly one wafer.

In some implementations of the apparatus, the apparatus may further include a first wafer receptacle including one or more first wafer supports configured to receive the first set of one or more wafers. In such implementations, the one or more first wafer supports may each be configured to support a wafer placed thereupon and within a limit region envelope associated with the first wafer receptacle and having a minimum horizontal dimension of $D_2$, wherein $D_2$ is greater than $D_1$ by at least the first threshold amount. In some such implementations of the apparatus, the first wafer receptacle may further include a second edge-detection system configured to register, when the second edge-detection system is activated, when an edge of an object intersects one or more second horizontal locations monitored by that second edge-detection system.

In some implementations of the apparatus, the one or more memory devices may further store computer-executable instructions for further controlling the one or more processors to cause the wafer handling robot to place at least some of the wafers in the first set of one or more wafers into the first wafer receptacle responsive, at least in part, to a determination that the first slip amount for the first set of one or more wafers is less than the first threshold amount.

In some further implementations of the apparatus, the one or more memory devices may further store computer-executable instructions for further controlling the one or more processors to: determine a first wafer offset for the first set of one or more wafers based on the information indicative of the length and orientation of the first reference line segment for the first set of one or more wafers; and cause the wafer handling robot to operate, during one or more operations where the first set of one or more wafers is supported by the wafer handling robot, to place the at least some of the wafers in the first set of one or more wafers into the first wafer receptacle in accordance with the first wafer offset.

In some implementations of the apparatus, the one or more memory devices may further store computer-executable instructions for further controlling the one or more processors to cause the wafer handling robot to place the wafers in the first set of one or more wafers into a second wafer receptacle responsive, at least in part, to a determination that the first slip amount for the first set of one or more wafers is more than the first threshold amount; and cause, thereafter and during a second time period, the wafer handling robot to, for each wafer in the first set of wafers, retrieve the wafer from the second wafer receptacle, cause the first edge-detection system, while the wafer is supported by the wafer handling robot, to obtain information indicative of at least three second horizontal coordinates along the silhouette edge of the wafer relative to the first reference point, determine an estimated center point of the wafer relative to the first reference point using the at least three second horizontal coordinates, determine a second center deviation by determining information indicative of the length and direction of a second reference line segment extending from the estimated center point of the wafer to the first reference point, determine a second wafer offset for the wafer based on the information indicative of the length and orientation of the second reference line segment for the wafer, and cause the wafer handling robot to operate, during one or more operations where the wafers is supported by the wafer handling robot, to place the wafer into the first wafer receptacle in accordance with the second wafer offset.

In some implementations, a method for handling one or more wafers of a nominal diameter $D_1$ may be provided. The method may include a) retrieving a first set of one or more wafers of nominal diameter $D_1$ using a wafer handling robot configured to support the first set of one or more wafers when the first set of one or more wafers is placed thereupon, the first set of one or more wafers defining a silhouette edge in a horizontal plane when viewed along a vertical axis; b) obtaining information regarding a first reference point of the wafer handling robot using a first edge-detection system; c) obtaining information indicative of first horizontal coordinates of at least five points along the silhouette edge of the first set of one or more wafers relative to the first reference point using the first edge-detection system; d) determining, for the first set of one or more wafers, the smallest circle that, when viewed along a vertical axis, circumscribes the first horizontal coordinates of the at least five points determined in (c); e) determining, for the first set of one or more wafers, a first center deviation by determining information indicative of the length and direction of a first reference line segment extending from the center of the smallest circle for the first set of one or more wafers to the first reference point; f) determining a first slip amount for the first set of one or more wafers that is based on the difference between the diameter of the smallest circle and $D_1$; and g) determining whether the first slip amount for the first set of one or more wafers exceeds a first threshold amount.

In some implementations of the method, the first edge-detection system may include three first through-beam optical sensors and each first through-beam optical sensor may be configured to emit a corresponding vertically oriented optical beam when activated, positioned such that the furthest horizontal distance between any of the optical beams, when the first through-beam optical sensors are activated, is less than $D_1$, and configured to register, when the first through-beam optical sensor is activated, when the optical beam emitted thereby intersects an edge of an object. In such implementations, (c) may be performed by obtaining horizontal coordinates for each instance where the silhouette edge of the first set of one or more wafers intersects one of the optical beams emitted by one of the first through-beam optical sensors.

In some implementations of the method, the first edge-detection system may include a machine-vision system configured to obtain the information indicative of the first horizontal coordinates of the at least five points along the silhouette edge of the first set of one or more wafers relative to the first reference point, and (c) may be performed using the machine-vision system to obtain the horizontal coordinates of the at least five points.

In some implementations of the method, the first edge-detection system may include one or more items selected from the group consisting of: a set of three or more direct through-beam optical sensors, a set of three or more reflective through-beam optical sensors, a machine vision measurement system, and a set of three or more capacitive sensors.

In some implementations of the method, the wafer handling robot may include an end effector having N blades, the first set of one or more wafers may include N or fewer wafers, each blade may be configured to support one of the wafers of nominal diameter $D_1$, and N may be greater than 1.

In some further implementations of the method, the N blades may include a first set of N-1 blades that are fixed with respect to one another, the first set of N-1 blades may be configured to move as a unit relative a portion of the wafer handling robot to which the first set of N-1 blades are attached, and the blade of the end effector that is not in the first set of N-1 blades may be configured to be movable relative to the portion of the wafer handling robot to which the first set of N-1 blades are attached independently of the first set of N-1 blades. In some such implementations of the method, N may equal 5.

In some implementations of the method, the wafer handling robot may include an end effector having exactly one blade and the first set of one or more wafers may include exactly one wafer.

In some implementations of the method, $D_1$ may be less than $D_2$ by at least the first threshold amount, $D_2$ may be the minimum horizontal dimension of a limit region envelope associated with a first wafer receptacle including one or more first wafer supports configured to receive the first set of one or more wafers, and the one or more first wafer supports may each be configured to support a wafer placed thereupon and within the limit region envelope.

In some such implementations, the first wafer receptacle may further include a second edge-detection system configured to register, when the second edge-detection system is activated, when an edge of an object intersects one or more second horizontal locations monitored by that second edge-detection system.

In some implementations of the method, the method may further include determining, in (g), that the first slip amount for the first set of one or more wafers is less than the first threshold amount, and h) causing the wafer handling robot to place at least some of the wafers in the first set of one or more wafers into the first wafer receptacle responsive, at least in part, to the determination that the first slip amount for the first set of one or more wafers is less than the first threshold amount. In some such implementations of the method, the method may further include i) determining a first wafer offset for the first set of one or more wafers based on the information indicative of the length and orientation of the first reference line segment for the first set of one or more wafers, and j) causing the wafer handling robot to operate, during one or more operations where the first set of one or more wafers is supported by the wafer handling robot, to place the at least some of the wafers in the first set of one or more wafers into the first wafer receptacle in accordance with the first wafer offset.

In some implementations of the method, the method may further include h) causing the wafer handling robot to place the wafers in the first set of one or more wafers into a second wafer receptacle responsive, at least in part, to a determination that the first slip amount for the first set of one or more wafers is more than the first threshold amount; and i) causing, after (h) and during a second time period, the wafer handling robot to, for each wafer in the first set of wafers: retrieve the wafer from the second wafer receptacle, cause the first edge-detection system, while the wafer is supported by the wafer handling robot, to obtain information indicative of at least three second horizontal coordinates along the silhouette edge of the wafer relative to the first reference point, determine an estimated center point of the wafer relative to the first reference point using the at least three second horizontal coordinates, determine a second center deviation by determining information indicative of the length and direction of a second reference line segment extending from the estimated center point of the wafer to the first reference point, determine a second wafer offset for the wafer based on the information indicative of the length and orientation of the second reference line segment for the wafer, and cause the wafer handling robot to operate, during one or more operations where the wafers is supported by the wafer handling robot, to place the wafer into the first wafer receptacle in accordance with the second wafer offset.

In some implementations, a non-transitory, computer-readable medium may be provided that stores computer-executable instructions thereon for controlling one or more processors to: a) cause a first set of one or more wafers of nominal diameter $D_1$ to be retrieved using a wafer handling robot configured to support the first set of one or more wafers when the first set of one or more wafers is placed thereupon, the first set of one or more wafers defining a silhouette edge in a horizontal plane when viewed along a vertical axis; b) obtain information regarding a first reference point of the wafer handling robot using a first edge-detection system; c) obtain information indicative of first horizontal coordinates of at least five points along the silhouette edge of the first set of one or more wafers relative to the first reference point using the first edge-detection system; d) determine, for the first set of one or more wafers, the smallest circle that, when viewed along a vertical axis, circumscribes the first horizontal coordinates of the at least five points determined in (c); e) determine, for the first set of one or more wafers, a first center deviation by determining information indicative of the length and direction of a first reference line segment extending from the center of the smallest circle for the first set of one or more wafers to the first reference point; f) determine a first slip amount for the first set of one or more wafers that is based on the difference between the diameter of the smallest circle and $D_1$; and g) determine whether the first slip amount for the first set of one or more wafers exceeds a first threshold amount.

In some implementations of the non-transitory, computer-readable medium, the first edge-detection system may include three first through-beam optical sensors where each first through-beam optical sensor is: configured to emit a corresponding vertically oriented optical beam when activated, positioned such that the furthest horizontal distance between any of the optical beams, when the first through-beam optical sensors are activated, is less than $D_1$, and configured to register, when the first through-beam optical sensor is activated, when the optical beam emitted thereby intersects an edge of an object. In such implementations, the non-transitory, computer-readable medium may further store instructions for controlling the one or more processors to operate the three first through-beam optical sensors to cause the horizontal coordinates of (c) to be obtained for each instance where the silhouette edge of the first set of one or more wafers intersects one of the optical beams emitted by one of the first through-beam optical sensors.

In some implementations of the non-transitory, computer-readable medium, the first edge-detection system may include a machine-vision system and the machine-vision system is configured to obtain the information indicative of the first horizontal coordinates of the at least five points along the silhouette edge of the first set of one or more wafers relative to the first reference point; and the non-transitory, computer-readable medium may further store instructions for controlling the one or more processors to interface with the machine-vision system and to cause the horizontal coordinates of of (c) to be obtained using the machine-vision system.

In some implementations of the non-transitory, computer-readable medium, the first edge-detection system may include, and the non-transitory, computer-readable medium may further store instructions causing the one or more processors to interface and communicate with, one or more of: a set of three or more direct through-beam optical sensors, a set of three or more reflective through-beam optical sensors, a machine vision measurement system, or a set of three or more capacitive sensors.

In some implementations of the non-transitory, computer-readable medium, $D_1$ may be less than $D_2$ by at least the first threshold amount, $D_2$ may be the minimum horizontal dimension of a limit region envelope associated with a first wafer receptacle including one or more first wafer supports configured to receive the first set of one or more wafers, and the one or more first wafer supports may each be configured to support a wafer placed thereupon and within the limit region envelope.

In some implementations of the non-transitory, computer-readable medium, the non-transitory, computer-readable medium may further store instructions for controlling the one or more processors to: determine, in (g), that the first slip amount for the first set of one or more wafers is less than the first threshold amount, and h) cause the wafer handling robot to place at least some of the wafers in the first set of one or more wafers into the first wafer receptacle responsive, at least in part, to the determination that the first slip amount for the first set of one or more wafers is less than the first threshold amount.

In some such implementations of the non-transitory, computer-readable medium, the non-transitory, computer-readable medium may further store instructions for controlling the one or more processors to: i) determine a first wafer offset for the first set of one or more wafers based on the information indicative of the length and orientation of the first reference line segment for the first set of one or more wafers; and j) cause the wafer handling robot to operate, during one or more operations where the first set of one or more wafers is supported by the wafer handling robot, to place the at least some of the wafers in the first set of one or more wafers into the first wafer receptacle in accordance with the first wafer offset.

In some implementations of the non-transitory, computer-readable medium, the non-transitory, computer-readable medium may further store instructions for controlling the one or more processors to: h) cause the wafer handling robot to place the wafers in the first set of one or more wafers into a second wafer receptacle responsive, at least in part, to a determination that the first slip amount for the first set of one or more wafers is more than the first threshold amount; and i) cause, after (h) and during a second time period, the wafer handling robot to, for each wafer in the first set of wafers: retrieve the wafer from the second wafer receptacle, cause the first edge-detection system, while the wafer is supported by the wafer handling robot, to obtain information indicative of at least three second horizontal coordinates along the silhouette edge of the wafer relative to the first reference point, determine an estimated center point of the wafer relative to the first reference point using the at least three second horizontal coordinates, determine a second center deviation by determining information indicative of the length and direction of a second reference line segment extending from the estimated center point of the wafer to the first reference point, determine a second wafer offset for the wafer based on the information indicative of the length and orientation of the second reference line segment for the wafer, and cause the wafer handling robot to operate, during one or more operations where the wafers is supported by the wafer handling robot, to place the wafer into the first wafer receptacle in accordance with the second wafer offset.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 15 depicts Tables 1 and 2.

Figure 1A:
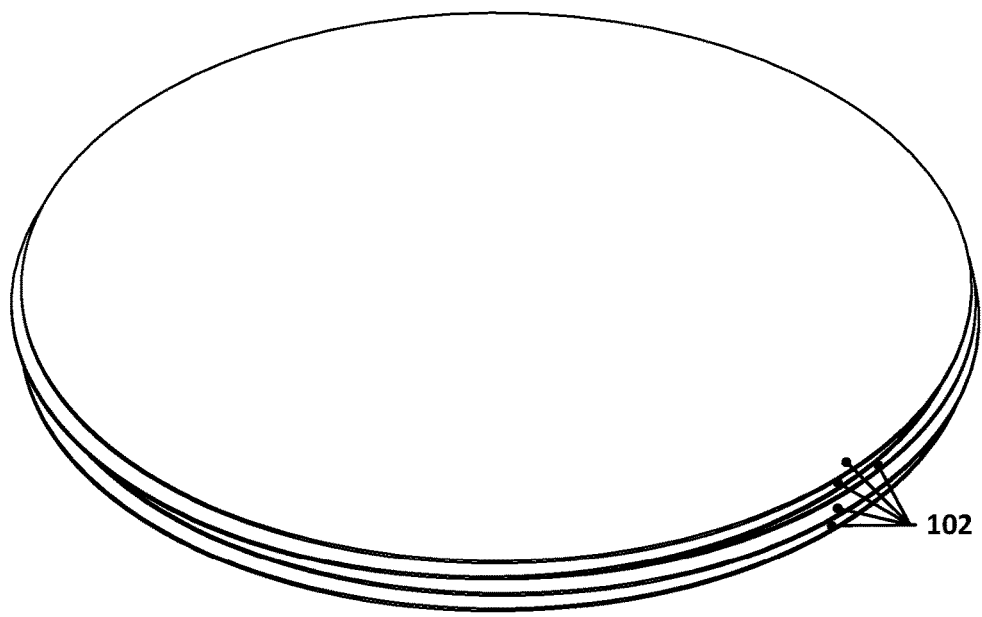
FIGS. 1A and 1B depict a stack of wafers that have experienced inter-wafer misalignment.

The Figures herein are generally not drawn to scale, although various aspects of the Figures, e.g., as discussed below, may be drawn to scale.

DETAILED DESCRIPTION

Wafer handling robots are typically equipped with highly precise positioning sensors that monitor, for example, the amount of rotation in each robot arm joint. Through measuring such rotations and knowing the distances between rotational centers of each link in the robot arm, the wafer handling robot is able to track the position of any point on the robot arm, including the end effector, very precisely relative to the robot arm base and world coordinate system.

Wafer handling robots, however, must interact with other objects in the semiconductor processing tool, e.g., load locks, front-opening unified pods (FOUPs), wafer buffers, etc. Such additional components may be mounted in the semiconductor processing tool in various locations, and each may have its own slight variations in how it is mounted relative to the other components and/or the wafer handling robot due to assembly tolerances and other factors. Once a wafer handling robot is installed in a tool (and periodically thereafter, e.g., after equipment has been removed for service and then reinstalled or replaced), it may be trained so as to "learn" the precise locations of each potential wafer pick-up and drop-off location (or "station").

Such training, for example, may be performed by placing the robot arm in a free-movement mode where the robot arm may be freely repositioned through the application of external force to the robot arm links and then positioning the end effector of the robot arm in a desired location relative to each wafer station. In most applications, this may involve aligning a nominal center point of an end effector, i.e., a location of the end effector that would be coincident with a center line of a wafer that was considered to be optimally supported by the end effector (e.g., centered between wafer support pads of the end effector or centered along a centerline of the end effector) would be aligned with an axis of the station that would ideally intersect the center of a wafer that was perfectly placed on the station. Such positioning of the end effector relative to each wafer station may be accomplished through the use of a fixture that may be fixed in place relative to the wafer station and/or end effector and that is engineered to allow the end effector to be accurately positioned. Once such relative positioning has been set up, the wafer handling robot may be caused to "learn" that station position, e.g., the wafer handling robot may determine the location of that station position based on the feedback from the wafer handling robot positioning sensors and other information, e.g., distance between rotational centers of the robot arm joints. Once the wafer handling robot has learned all of the station locations, the robot may later be caused to return to any learned station location based on the learned location information.

While the robot arm may, by virtue of its positioning sensors, be caused to precisely and repeatedly navigate between the various learned station locations during operation, if there is slippage between a wafer and the end effector, then the wafer will, when placed in a station, be off-center with respect to the ideal or target location for that station. In order to correct for such potential misalignment, a technology called automatic wafer centering may be used.

In equipment with automatic wafer centering (AWC), each station where precise wafer placement is required may be equipped with a pair of through-beam optical sensors; each through-beam optical sensor may be configured to provide a vertically oriented optical beam. Such sensors are usually positioned at the entrance to the station such that the wafer edge intersects with each vertically oriented optical beam twice (once with the leading edge of the wafer, once with the trailing edge of the wafer) as the wafer is translated through the entrance to the station by the wafer handling robot. The through-beam optical sensors may send a signal to the robot arm controller each time the wafer edge intersects with one of the optical beams. If the XY locations of the through-beam optical sensors and the XY location of the nominal center point of an end effector are known at the time when a through-beam optical sensor detects an edge intersection with the corresponding optical beam, then the XY location of the edge intersection relative to the nominal center point may be determined.

Prior to normal operation of an AWC system, a calibration wafer may be attached to the end effector in a location that is pre-set to be centered at a particular location, e.g., the nominal center point discussed earlier, relative to the end effector using one or more pins or other securement devices to fix the calibration wafer in place relative to the end effector in a repeatable and secure manner to prevent the calibration wafer from slipping laterally. The calibration wafer may be a precision-machined circular disk that has a known diameter, e.g., 300 mm. The calibration wafer may then be translated linearly through the through-beam optical sensor pair of the AWC, system so that each through-beam optical sensor detects the edge of the calibration wafer twice (once as the calibration wafer enters the optical beam and the second time as the calibration wafer exits the optical beam) and the XY coordinates of the nominal center point of the end effector may be determined for each intersection of the calibration wafer edge with the optical beam of each through-beam optical sensor. The XY coordinates of each through-beam optical sensor may be determined by using the nominal center point coordinates associated with the two edge intersections detected by that through-beam optical sensor and the known radius of the calibration wafer. For example, the location of the through-beam optical center and the two nominal center point coordinates may form a triangle that has one side extending between the two nominal center point coordinates (the length of which may be calculated based on the XY distance between those two coordinates) with the remaining two sides having lengths equal to the radius of the calibration wafer. Based on such information, two possible locations of the through-beam optical center may be identified (one on either side of the nominal center point). The most likely candidate of the two potential locations may then be selected (for example, there may be a predefined spatial envelope within which the location of a through-beam optical sensor may be expected; one solution may fall within the envelope and the other may be outside of it—the one within may be selected as the actual location).

After calibration and determination of the locations of the through-beam optical sensors, the AWC system may be used to scan normal wafers that may experience slippage relative to the end effector. When a normal wafer, e.g., a wafer being processed in the semiconductor processing tool, is placed on the end effector and then caused to move through the AWC system, the XY location may be obtained for each location where the wafer edge intersects with the optical beam of one of the through-beam optical sensors (in effect, the XY location of the through-beam optical sensor that detected the edge intersection). Based on the XY coordinates for each such intersection and the associated XY coordinates of the nominal center point of the end effector at that same time, the XY location of the edge intersection point relative to the nominal center point may be determined. Since all four edge intersection points lie along the edge of a circular wafer of known diameter, the location of the wafer center relative to the nominal center point of the end effector may be determined using any three of the four coordinates. In a typical system, four sets of three points may be evaluated to determine generally equally sized circles (since they all measure the same circular wafer) that share the same center point; if one of the circles that is determined is too small, then that circle determination may be ignored since it is likely the case that one of the edge intersections used intersected the wafer edge in a location that is not on the circular edge, e.g., an indexing notch in the circular edge. In a perfectly centered wafer, the center point of the wafer and the nominal center point of the end effector will be coincident with each other in the XY plane. However, if there is misalignment between the two, then the X- and Y-offsets between the nominal center point and the wafer center points may be determined and then used by the robot arm controller to adjust the final placement of the wafer at the target location of the station so as to cause the wafer to be re-centered on the target location.

Figure 1B:
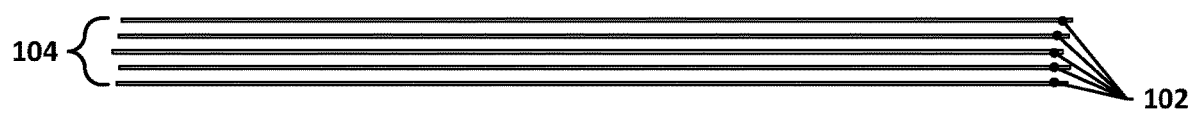

The present inventors determined that traditional AWC techniques would be non-viable for high-capacity end effectors, i.e., end effectors that may transport multiple wafers simultaneously in a stacked arrangement. For example, some end effectors may include multiple, e.g., five, blades arranged in a vertical stack, with each blade configured to support a wafer from below. During movement of wafer handling robots equipped with such high-capacity end effectors, each wafer supported thereby may undergo slippage to different degrees (and even in different directions), depending on factors such as contact pad wear variability, wafer variability, and other parameters. An example of such a misaligned wafer stack is shown in FIG. 1; as can be seen, there are five wafers 102 placed in the stack 104. The wafers are shown in isolation, although in reality they would be supported by some other structure in such a stacked arrangement, e.g., an end effector or a wafer receptacle, such as a FOUP. As a result of such misalignment, the stack of wafers supported by the end effector may not have a not have a circular silhouette edge when viewed in the XY plane.

The term "silhouette edge," as used herein, refers to the profile defined by the outermost edge(s) of a collection of objects when orthographically projected along an axis and onto a plane perpendicular to that axis. For example, if two 3" squares were stacked on top of each other with their centers offset from each other by a distance of 1" along an axis parallel to one of the square edges, the silhouette edge of such an arrangement in a plane parallel to the plane of the squares would be a rectangle of 3" by 4".

As a result, traditional AWC techniques do not provide results that are sufficiently accurate enough to allow them to be used with stacked wafers. The present inventors conceived of an AWC system in which there was at least a third through-beam optical sensor in addition to the two through-beam optical sensors typically used. In this enhanced AWC system, each transit of a wafer through the through-beam optical sensors would result in at least six XY coordinates instead of the usual four XY coordinates. These six or more coordinates are then initially used by the enhanced AWC system in a different manner than the four coordinates in a typical AWC system. For example, in a typical AWC system, the assumption is made that the wafer has a round silhouette edge with a given diameter. In the enhanced AWC system described in more detail below, no categorical assumptions are made regarding the diameter of the wafers) and, in instances where a stack of wafers is being processed, the circularity of the silhouette edge. Instead, a determination is made as to the smallest diameter circle (also referred to herein simply as the "smallest circle") that circumscribes the six coordinates (or more if even more through-beam optical sensors are used). This smallest circle is then used as an approximation of the boundaries of the wafer stack.

While the above discussions and the examples discussed elsewhere herein focus on optical-through beam sensor systems, the techniques discussed herein may be implemented using any suitable edge-detection system that is configured to obtain information indicative of horizontal coordinates associated with the intersection of an edge of an object, e.g., a semiconductor wafer, with various predefined locations. Such edge-detection systems may include, for example, one or more sensors that are configured to obtain such measurements. Some edge-detection systems may, for example, utilize sensors such as through-beam optical sensors, e.g., sensors that include a light beam emitter configured to emit an optical beam and a photodetector that is positioned to receive the emitted optical beam; when an object intersects the light beam and interrupts it, this may be treated as the intersection of the edge of the object with the predefined location (which is coincident with the optical beam). Other edge-detection systems may use other types of sensors, for example, capacitive, ultrasonic, or other types of sensors that are able to obtain information indicative of horizontal coordinates associated with the intersections of the edge of an object with predefined locations. In some implementations, the edge-detection system may use a single sensor, e.g., an imaging sensor. In such imaging sensor-based edge-detection systems, machine vision algorithms may be used to monitor the assorted edge-detection locations.

The term "circumscribes," as used herein, is used in its normal sense relating to geometrical figures, i.e., to describe a figure that touches that which it circumscribes without cutting it. In the case of a collection of points, a geometric figure that circumscribes the collection of points would, for each point in the collection of points, either a) be coincident with or touch the point or b) contain the point within the figure, i.e., none of the points in the collection of points would be located outside of the figure (although some or all of them may lie along the exterior boundary of the figure).

Once the smallest circle has been determined as described above, the center deviation of the smallest circle relative to the nominal center point may be obtained by determining the XY coordinates of the center of the smallest circle relative to the nominal center point of the end effector. This center deviation may be used as described above with regard to typical automatic wafer centering systems.

In some implementations, enhanced AWC systems may also make a determination as to information indicative of the diameter of the smallest circle and then compare that information against a corresponding threshold quantity, e.g., of a cylindrical stay-out zone, for example. If such a comparison indicates that the smallest circle is larger than the stay-out zone, then an error condition may be enabled that indicates that the wafer stack is sufficiently misaligned that correction based on the center deviation will not be sufficient to meet process requirements. Such an error condition may trigger additional operations that may be used to address the issue.

While not necessary to understand the operation of enhanced AWC systems as described herein, FIGS. 2A through 2G depict diagrams of a calibration wafer being translated through optical beams of three through-beam optical sensors that are part of an enhanced AWC system. Such an operation may be used to allow the robot arm control system to determine the locations of the three or more through-beam optical sensors that are used in each enhanced AWC system.

Figure 2A:
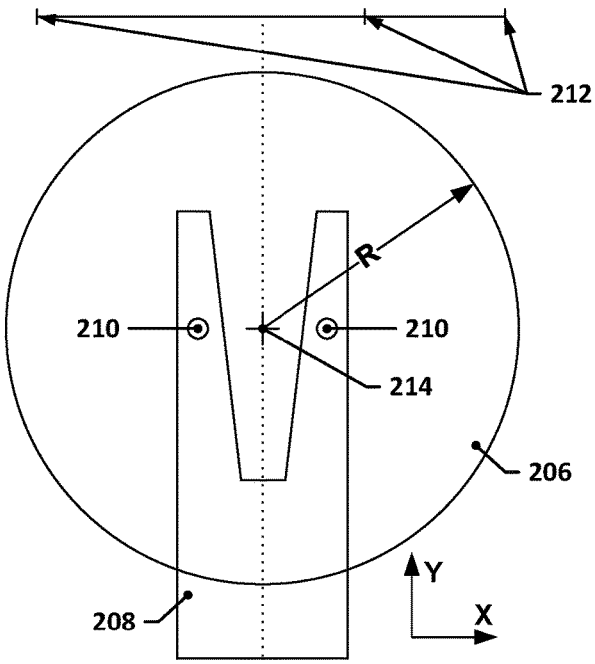
FIGS. 2A through 2G depict diagrams of a calibration wafer being translated through optical beams of three through-beam optical sensors that are part of an enhanced AWC system.
Figure 2B:
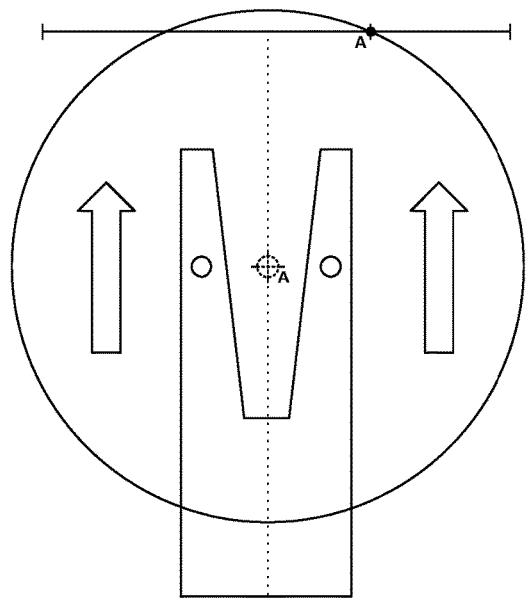
Figure 2C:
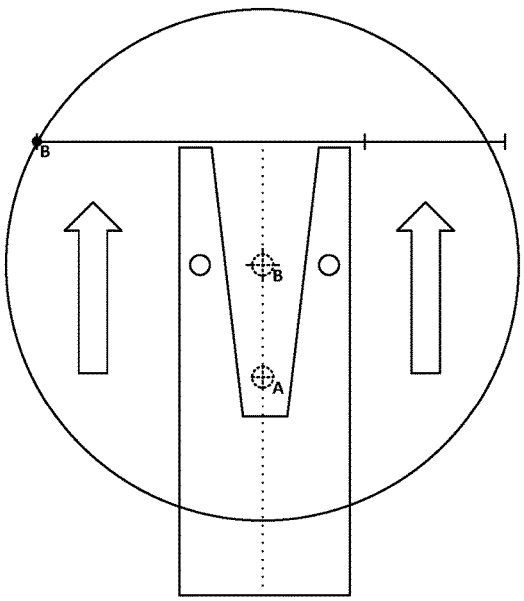
Figure 2D:
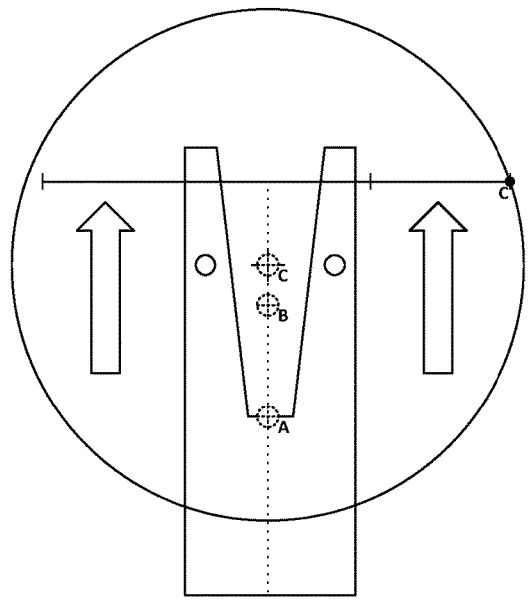
Figure 2E:
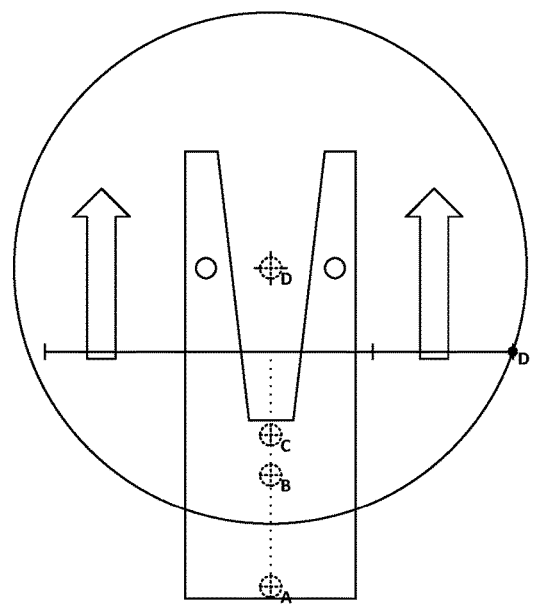
Figure 2F:
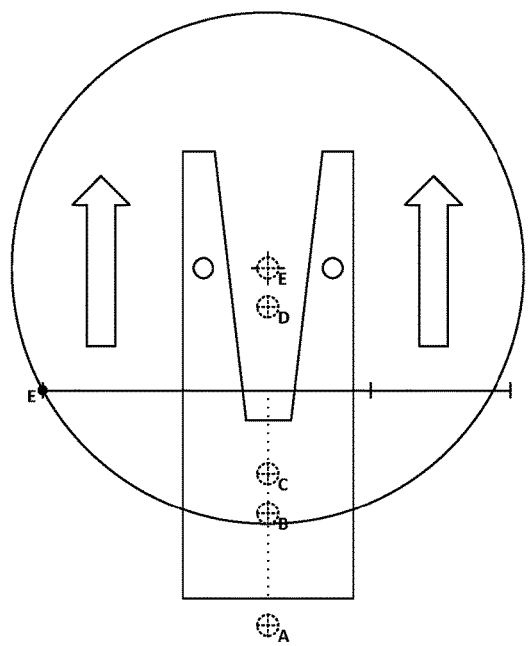
Figure 2G:
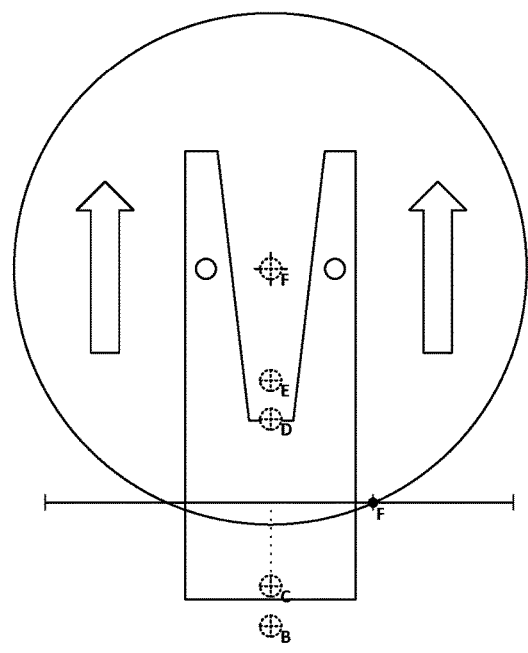

In FIG. 2A, a calibration wafer 206 of radius R, e.g., 150 mm for a 300 mm wafer system, is supported by a blade 208 of an end effector (not shown) and pinned into place relative to the blade 208 by pins 210 or other fixturing elements. The calibration wafer 206 is pinned so that it has a center point that aligns with a nominal center point 214 of the blade 208 (and end effector of which the blade 208 is part). Three or more (this example uses three) through-beam optical sensors 212 are spaced apart at different intervals with the optical beams that they emit traveling in a vertically oriented direction (perpendicular to the page in the context of the Figures). In this example, the through-beam optical sensors 212 are unevenly spaced such that only one through-beam optical sensor 212 will generally intersect with the edge of the calibration wafer 206 at a time (given the general direction of travel of the blade 208), thus providing a form of time-division multiplexing that may allow for a single channel to be used to receive the signals from the through-beam optical sensors 212. In other implementations, the through-beam optical sensors 212 may each be connected to their own dedicated channel such that the output of each through-beam optical sensor may be independently monitored without resorting to time-division multiplexing. The through-beam optical sensors 212 may be generally distributed in a manner that will result in a distribution of measurement points that spans most of the wafer(s), e.g., 80% to 90% or more of the wafer diameter, to provide for widely spaced measurement points to allow for more accurate determination of location information. In the examples discussed herein, there are three through-beam optical sensors positioned at −132 mm, 60 mm, and 142 mm from a reference axis that would, for example, correspond with the axis along which the nominal center point of the end effector would translate when passed through the enhanced AWC system. It will be understood, of course, that other spacings (and even additional through-beam optical sensors) may be used as well based on the particular constraints of a given semiconductor processing tool. For example, if the blade of the end effector is 130 mm wide, then a through-beam optical sensor positioned at 60 mm from the above-discussed frame of reference would likely only be able to detect the leading edge of a wafer; the trailing edge would be blocked from the sensor's view by the blade (although this may be avoided by including a cutout or other opening in the end effector in the vicinity of where the wafer edge is expected to intersect with the optical beam). Shifting such a through-beam optical sensor by 10 or 15 mm outwards would, for example, allow such blockage to be avoided.

FIGS. 2B through 2G depict the calibration wafer 206 during translation of the calibration wafer 206 in a direction perpendicular to the line along which the through-beam optical sensors 212 are arranged, although it will be understood that the calibration wafer may also be translated through the through-beam optical sensors 212 along other directions that are not necessarily orthogonal to the plane defined by the optical beams of the through-beam optical sensors 212 to similar effect. In FIGS. 2B through 2G, the calibration wafer 206 and blade 208 are shown stationary while the three through-beam optical sensors 212 are translated along the translation axis, but this is simply a convention to facilitate fitting the Figures onto fewer pages—in reality, the through-beam optical sensors 212 would be stationary and the calibration wafer 206 and blade 208 would be moved.

As the calibration wafer 206 is translated through the optical beams of the through-beam optical sensors 212, the location of the nominal center point 214 (or some other reference point that is fixed with respect to the end effector) may be identified at each instant in time when the edge of the calibration wafer intersects with one of the through-beam optical sensors. Thus, in FIG. 2A, when the middle through-beam optical sensor 212 registers that the edge of the calibration wafer 206 has intersected the optical beam of that through-beam sensor 212 at point A, the position of the nominal center point 214 may be logged (as indicated by the circular dotted crosshairs A). Similar nominal wafer center positions may be logged for the other intersections of the calibration wafer 206 edge with one of the through-beam optical sensor 212 optical beams, e.g., as shown for intersections/nominal center point 214 locations B, C, D, E, and F in FIGS. 2C through 2G.

Figure 2H:
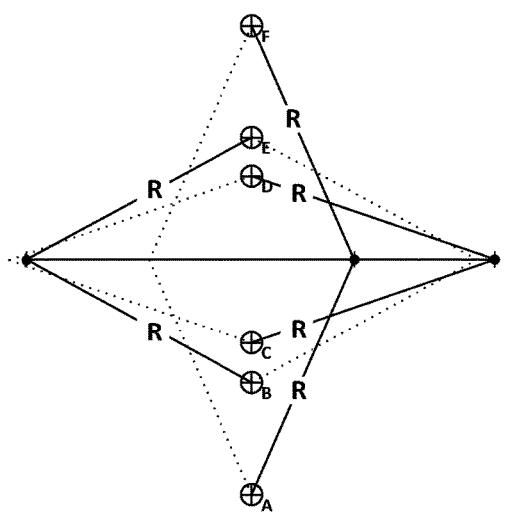
FIG. 2H depicts potential locations of the through-beam optical sensors based on calibration measurements.

After such data capture, the captured nominal center point locations and the radius R of the calibration wafer 206 may be used to determine the actual locations of the through-beam optical sensors 212. For example, nominal center point 214 locations A and F should each be a distance R from the middle through-beam optical sensor, as shown in FIG. 2H; in other words, if circles of radius R were to be centered on each of locations A and F, those two circles would intersect each other twice—either intersection point could be a possible location of the associated through-beam optical sensor 212 (in FIG. 2H, lines of length R connect locations A and F, B and E, and C and D with their respective potential through-beam optical sensor locations—solid lines are used to indicate the "actual" locations and dotted lines to indicate the "phantom" locations). Once these two locations are determined, the one that is closest to the theoretical location, e.g., as defined in engineering drawings, of the through-beam optical sensor 212 location may be deemed to be the actual through-beam optical sensor 212 location (the actual locations of the through-beam optical sensors 212 will deviate from those theoretical locations due to factors such as manufacturing tolerances, assembly misalignment, thermal expansion, etc.—such variance, while significant with respect to wafer alignment, should not cause the through-beam optical sensors to move so far as to potentially be nearer the "phantom" location than the "true" location).

Once the actual locations of the through-beam optical sensors 212 have been obtained, the enhanced AWC system may be readied for use. The above-discussed example for determining the actual locations of the through-beam optical sensors 212 is merely representative; other techniques may be suitable as well. Moreover, the actual locations of the through-beam optical sensors 212 may be periodically re-evaluated, e.g., after a predetermined period of time or after maintenance operations have been performed that may have caused changes in equipment alignment or position.

Figure 3:
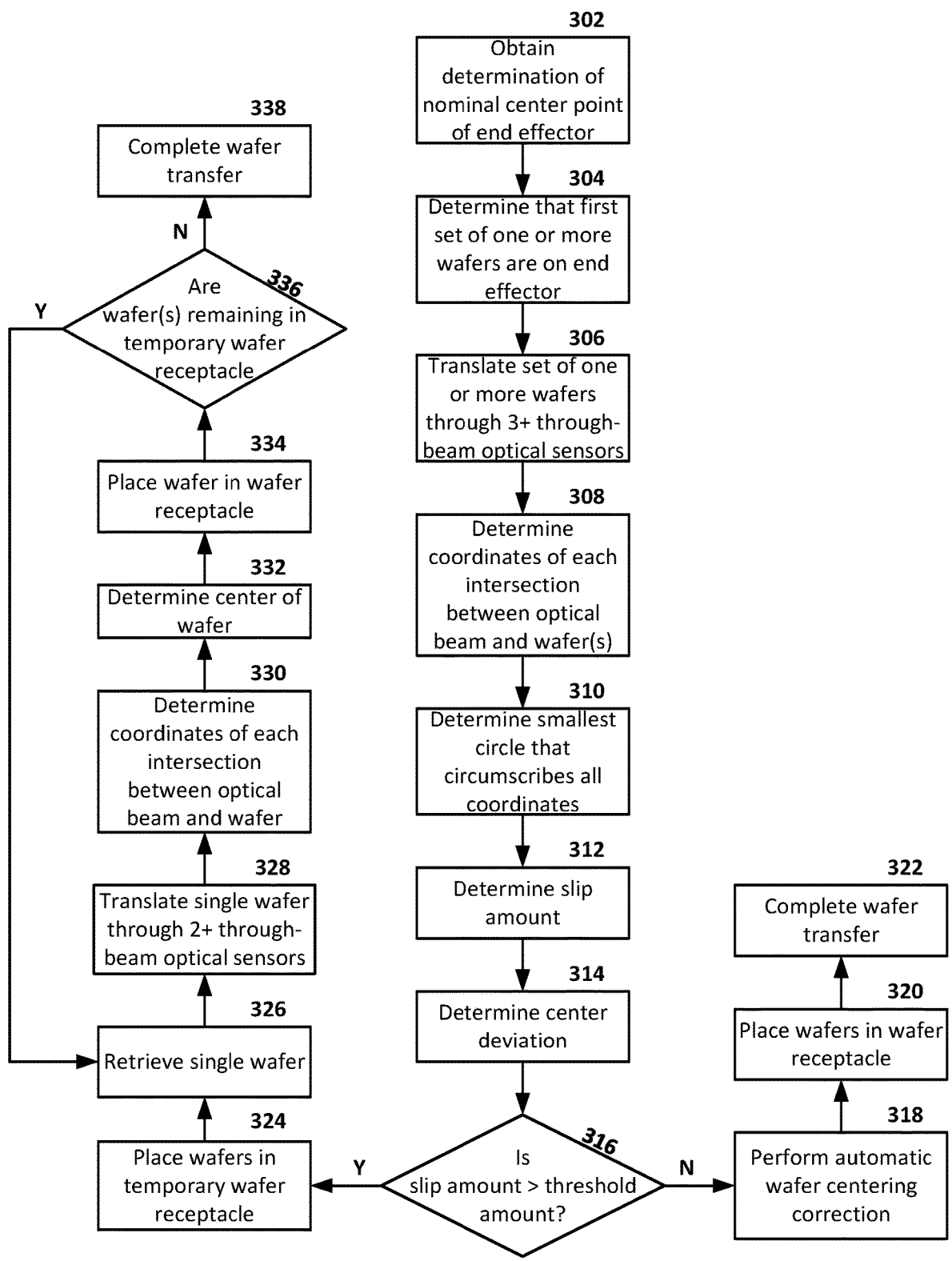
FIG. 3 depicts a flow diagram of a technique for using an enhanced AWC system.

FIG. 3 depicts a flow diagram of an example technique for using an enhanced AWC system. In block 302, the nominal center point of the end effector of a wafer handling robot as well as the locations of three or more through-beam optical sensors may be determined, e.g., through the use of a calibration wafer and as described previously.

At various points during the discussion of FIG. 3, reference may be made to any of FIGS. 4 through 13, which depict example portions of a semiconductor processing tool that includes an enhanced AWC system in various states of operation. Before engaging in discussion of the example technique of FIG. 3, various aspects of FIG. 4 will be discussed.

Figure 4:
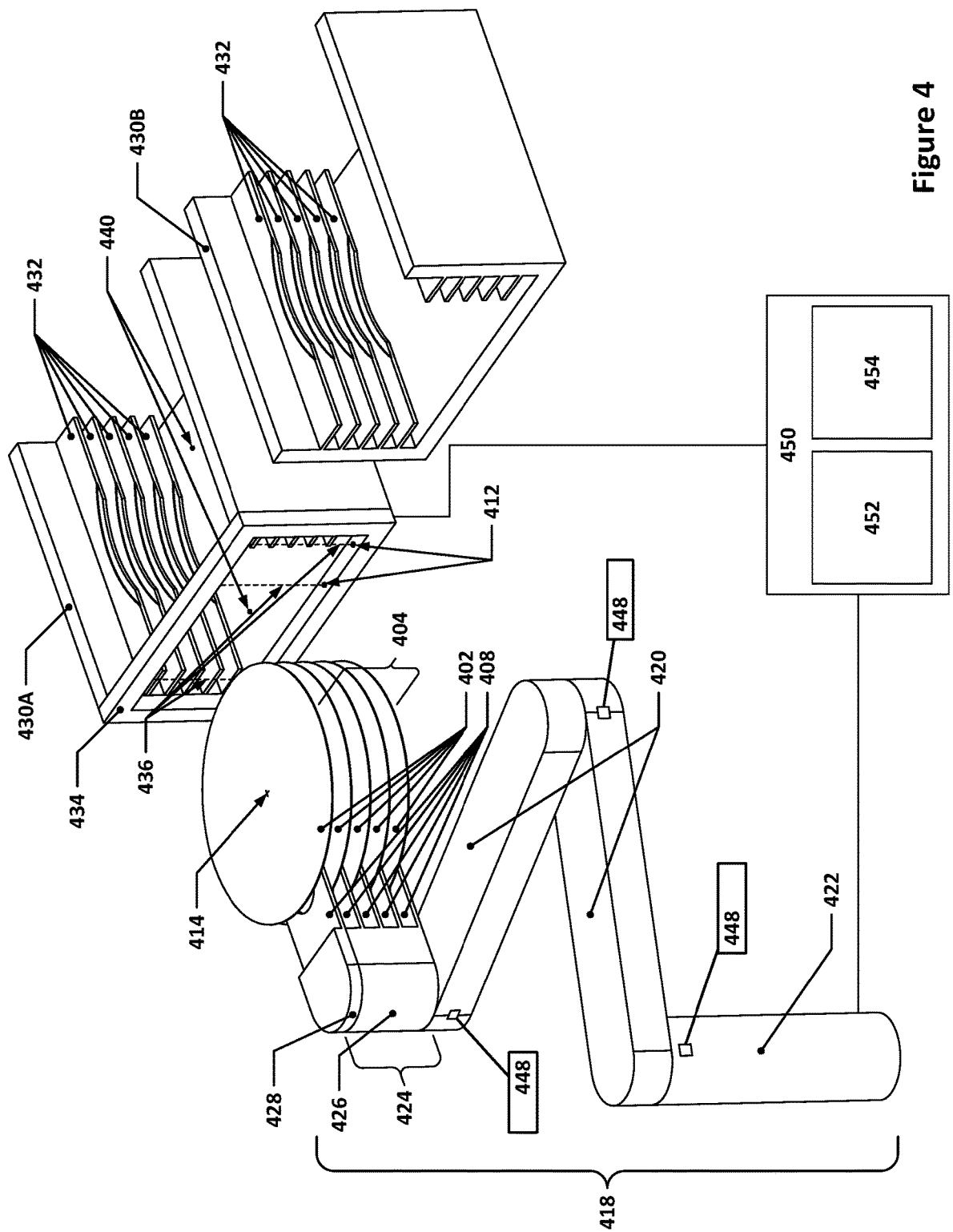
FIGS. 4 through 13 depict example portions of a semiconductor processing tool that includes an enhanced AWC system in various states of operation.

FIG. 4 depicts an isometric view of portions of a semiconductor processing tool—specifically, portions relating to wafer handling. As shown in FIG. 4, a wafer handling robot 418 is provided that includes a base 422, multiple links 420, and an end effector 424. The end effector 424, in this example, actually consists of two end effectors: a stack end effector 426 and a single end effector 428. The stack end effector 426 in this example includes four blades 408; the single end effector 428 includes a single blade 408. As will be seen later, the stack end effector 426 and the single end effector 428 may be independently movable such that the single end effector 428 may be used in isolation to move a single wafer 402 at a time. When the stack end effector 426 and the single end effector 428 are aligned with one another, then an entire stack 404 of wafers 402 may be supported and held in unison. The end effector 424 has a nominal center point 414 which generally coincides with the center points of the wafers 402 (of course, the wafers 402 may experience misalignment from the nominal center point 414, as discussed above).

Also shown in FIG. 4 is a first wafer receptacle 430A with a plurality of support shelves 432 (equivalent structures may be referred to herein simply as "wafer supports"); such a first wafer receptacle 430A may, for example, be representative of a buffer station for storing multiple wafers, a load lock for transferring wafers into or out of a vacuum environment, or any number of other types of equipment. A second wafer receptacle 430B is also depicted and may be configured in a generally similar manner to the first wafer receptacle 430A, e.g., have a plurality of support shelves 432 and be configured to receive multiple wafers simultaneously. The second wafer receptacle 430B may, for example, be a FOUP or other type of wafer-receiving device. The support shelves 432 in the first wafer receptacle 430A and the second wafer receptacle 430E (and other wafer receiving-structures) may each serve as one of the stations in the semiconductor processing tool of which the depicted equipment is part. In this example, the first wafer receptacle 430A may be equipped with an enhanced AWC system 434 that includes three or more through-beam optical sensors 412 that emit vertically oriented optical beams 436. The second wafer receptacle 430B in this example does not include an enhanced AWC system 434, although in some implementations, such an enhanced AWC system may be included in a manner similar to that discussed above with respect to the first wafer receptacle 430A.

Also visible in FIG. 4 is a controller 450 that may have one or more processors 452 and one or more memory devices 454. The controller 450 may be operably connected with the wafer handling robot 418 and the enhanced AWC system 434 such that it may control the operation of the wafer handling robot 418 and receive data from the enhanced AWC system 434. The wafer handling robot 418, for example, may include one or more position sensors 448 that may, for example, provide feedback on the position of the links 420 and the end effector 424 to the controller 450. Such feedback may be used to determine, for example, the angular orientations of the links 420 and the end effector 424 relative to the base 422 and each other, which may be used in conjunction with the distances between rotational centers for the various rotational joints in the wafer handling robot 418 to determine the location of any point, e.g., the nominal center point 414, on the wafer handling robot 418 at any time. The controller 450 may also be operably connected, in some implementations, with a plurality of protrusion sensors 440, which may be vertically oriented through-beam optical sensors, similar to those used in the enhanced AWC system 434. Many of the various systems and components discussed in this paragraph are not shown or called out in FIGS. 5 through 13.

Discussion now returns to FIG. 3. After the locations of the three or more through-beam optical sensors 212 are determined, the technique may proceed to block 304, in which a determination may be made that a first set of one or more wafers are being supported by the end effector (or should be on the end effector given the current wafer handling stage) and that the first set of one or more wafers should be checked for positioning and alignment relative to the end effector 424. For the purposes of this discussion, it will be assumed that the first set of one or more wafers is a set of five wafers, as depicted in FIGS. 4 through #13. However, it will be understood that the first subset of one or more wafers may include a different number of wafers. In some extreme cases, the first subset of one or more wafers may include only a single wafer. In such instances, there will be no inter-wafer slippage since there is only one wafer present. Standard AWC systems may be used in such cases, although the enhanced AWC techniques discussed herein may be used to provide more accurate placement of single wafers that, for example, vary from the size of the calibration wafers. Such systems may be of use when wafers 402 of the same nominal size may be handled by the wafer handling robot 418 while in different physical states, e.g., the same wafer 402 may have a different diameter when at an elevated temperature as compared with when it is at room temperature or some other lower temperature. For example, when a wafer 402 is removed from a processing chamber after processing, it may be several hundred degrees Celsius in temperature as compared with, for example, ~20 C when most recently last handled by the wafer handling robot 418. For example, a standard 300 mm semiconductor wafer may increase nearly 0.3 mm in size when at a temperature of 400 C as compared with room temperature. While such increases in size may be considered quite small, the standard tolerances for wafer diameter for 300 mm wafers are usually only ±0.5 mm, so such thermal expansion would be significant in view of the expected tolerances.

Figure 5:
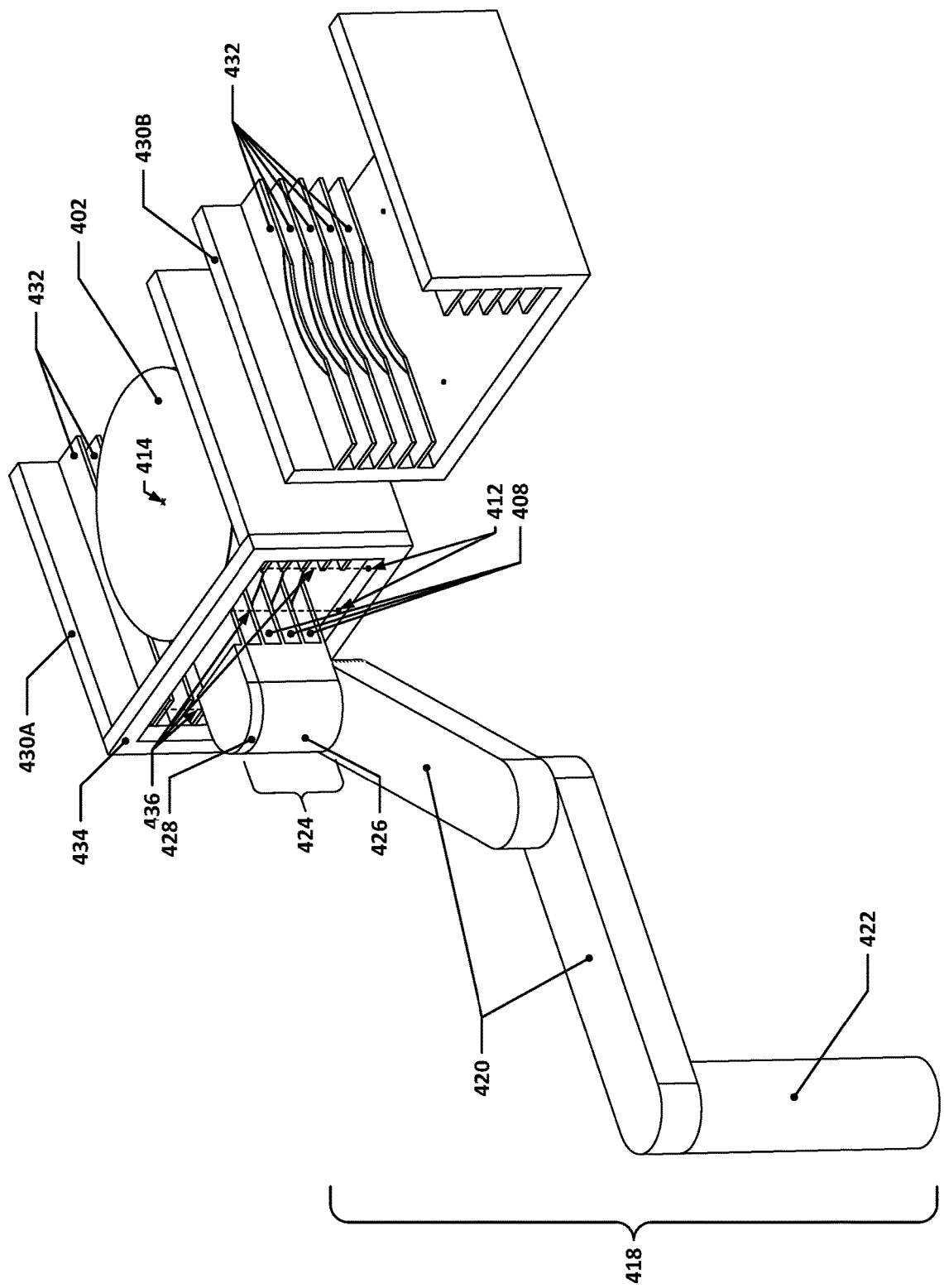

In block 306, the stack 404 of wafers 402 may be translated through the enhanced AWC system 434 during a first time period, as shown in FIG. 5. As the stack 404 translates through the optical beams 436, the through-beam optical sensor 412 associated with each optical beam 436 may register when the silhouette edge of the stack 404 of wafers 402 intersects with each optical beam 436. In block 308, a determination may be made as to the coordinates of each such intersection; such coordinates may be determined relative to the nominal center point 414 of the end effector 424, as discussed earlier.

FIGS. 14A through 14G depict diagrams of a top-down view of a stack of wafers 1402 that have been placed on an end effector 1408 as they are translated through a set of three through-beam optical sensors for the purposes of obtaining such coordinates; for purposes of this discussion, it may be assumed that the elements shown in FIGS. 14A through 14G are analogous to the corresponding elements in FIGS. 4 and 5. Similar elements in both sets of Figures have the last two digits of their callout numbers the same.

Figure 14A:
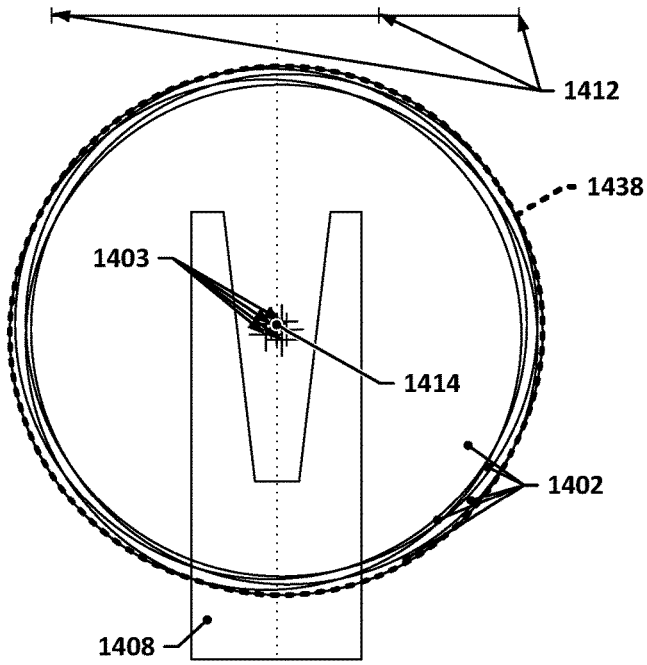
FIGS. 14A through 14G depict diagrams of a top-down view of a stack of wafers that have been placed on an end effector and translated through a set of three through-beam optical sensors.

As seen in FIG. 14A, three through-beam optical sensors 1412 are provided at various intervals across the path of travel of an end effector supporting blades 1408 which, in turn, support a stack of wafers 1402. In this example, the wafers 1402 have experienced observable misalignment such that their centers 1403 are clustered in a small cloud around a nominal center point 1414 of the end effector/blade 1408. The outlines of all five wafers 1402 in this case have been drawn, and the silhouette edge 1438 of the stack of wafers 1402 has been indicated with a thick dotted line to help in illustration. In FIGS. 14B through 14G, the individual wafers 1402 are not shown and the silhouette edge 1438 alone is shown instead.

Figure 14B:
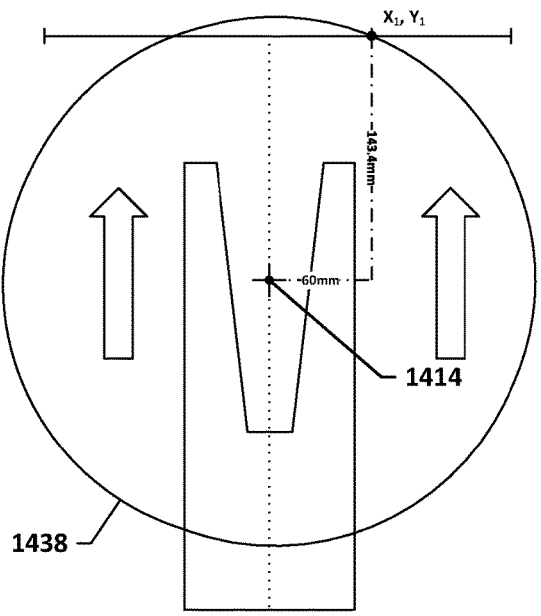
Figure 14C:
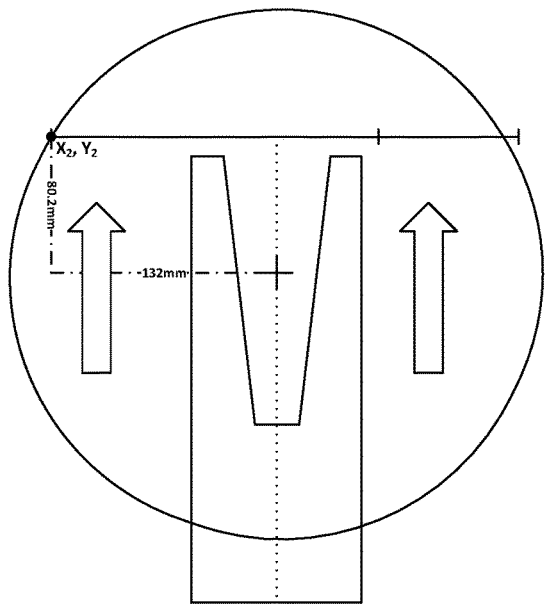
Figure 14D:
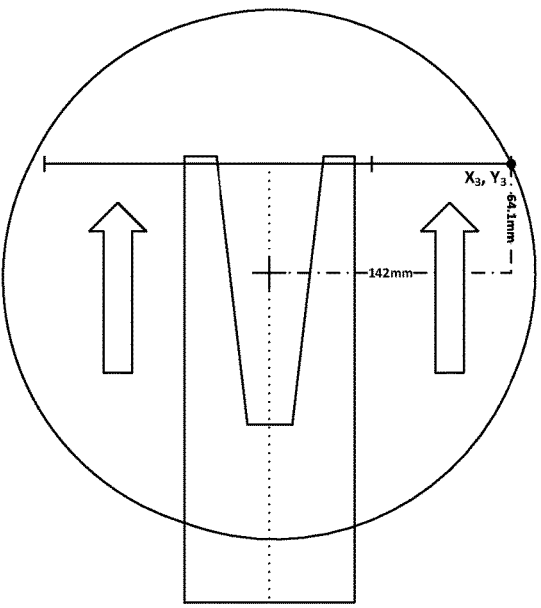
Figure 14E:
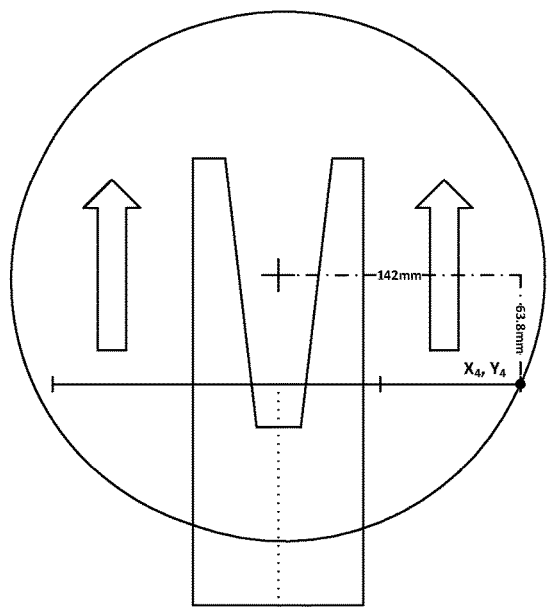
Figure 14F:
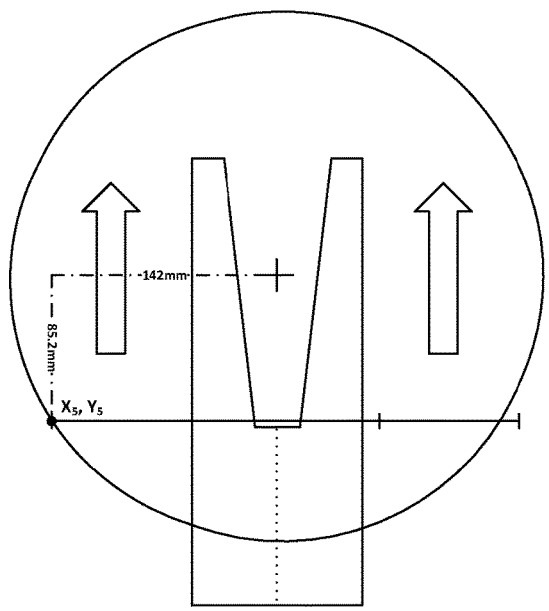
Figure 14G:
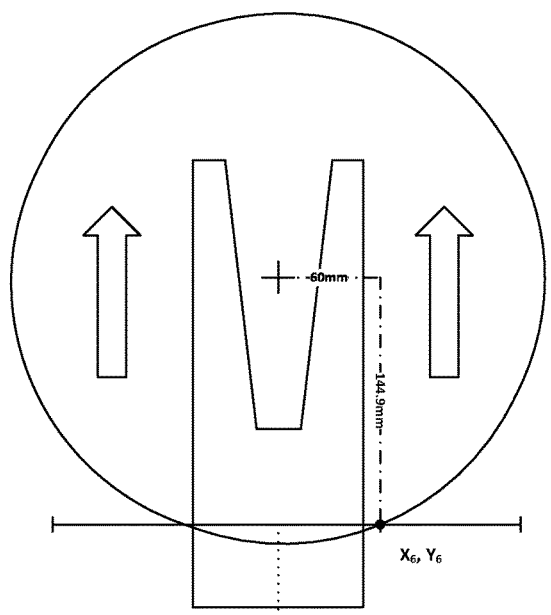

In FIG. 14B, the stack of wafers 1402 has been translated through the right-most through-beam optical sensor 1412, causing the robot arm controller to receive a signal from the right-most through-beam optical sensor 1412 indicating that the silhouette edge 1438 has intersected with the optical beam of that through-beam optical sensor 1412. The controller may then, responsive to receipt of such a signal, determine and store the XY position of the intersection point $(x_1, y_1)$ relative to the nominal center point 1414. This may, for example, be done through simple coordinate translation and subtraction. For example, the XY location of the through-beam optical sensor location in the world coordinate system and the XY location of the nominal center point 1414 in the same coordinate system may both be determined and the resulting location of the intersection point $(x_1, y_1)$ relative to the nominal center point 1414 may then be determined by subtracting each world coordinate of the nominal center point 1414 from the corresponding world coordinate of the intersection point $(x_1, y_1)$. At some point, a transformation may be made that causes the coordinates of the intersection point $(x_1, y_1)$ relative to the nominal center point 1414 to be defined with respect to a coordinate system that is fixed with respect to the end effector (or other frame of reference). For ease of reference, the example coordinates of the intersection point $(x_1, y_1)$ relative to the nominal center point 1414 are indicated by the values shown on the two orthogonal dash-dot-dash lines in FIG. 14B. Thus, the coordinates of the intersection point $(x_1, y_1)$ relative to the nominal center point 1414 in this example would be (60, 143.4) mm.

This process may be repeated for each subsequent intersection event, e.g., as shown for points $(x_2, y_2)$; $(x_3, y_3)$; $(x_4, y_4)$, $(x_5, y_5)$; and $(x_6, y_6)$ in FIGS. 14C, 14D, 14E, 14F, and 14G, respectively. Once all six coordinates have been obtained, a determination of the smallest circle that circumscribes all of the obtained coordinates may be made in block 310. Any suitable technique for making such a determination may be used. For example, in at least some implementations, a "brute force" approach may be implemented in which all potential triplet combinations of coordinates are evaluated to determine the parameters of the circle that passes through all of the coordinates in the triplet. The resulting circles may then be evaluated to determine a) the circle size and b) whether there are any coordinates that are not on or encircled by the circle. The smallest of the circles that circumscribes all of the coordinate points may then be identified and selected as the smallest circle.

For example, for each coordinate triplet $(x_1, y_1)$; $(x_2, y_2)$; and $(x_3, y_3)$ (where the subscripts are simply used to differentiate within the triplet and do not necessarily correlate with the subscripts above for the six example coordinate points), the center coordinates $(x_c, y_c)$ and radius r of the circle that is defined by the coordinate triplet may be determined according to:

$$x_c = \frac{(y_3 - y_2)(x_1^2 + y_1^2) + (y_1 - y_3)(x_2^2 + y_2^2) + (y_2 - y_1)(x_3^2 + y_3^2)}{2 \cdot [(x_3 - x_2)(y_2 - y_1) - (x_2 - x_1)(y_3 - y_2)]}$$

$$y_c = -\frac{(x_3 - x_2)(x_1^2 + y_1^2) + (x_1 - x_3)(x_2^2 + y_2^2) + (x_2 - x_1)(x_3^2 + y_3^2)}{2 \cdot [(x_3 - x_2)(y_2 - y_1) - (x_2 - x_1)(y_3 - y_2)]}$$

$$r = \sqrt{(x_1 - x_c)^2 + (y_1 - y_c)^2}$$

In the last equation for r, either of the other two coordinate points in the triplet may be substituted for $(x_1, y_1)$, of course.

Figure 16:
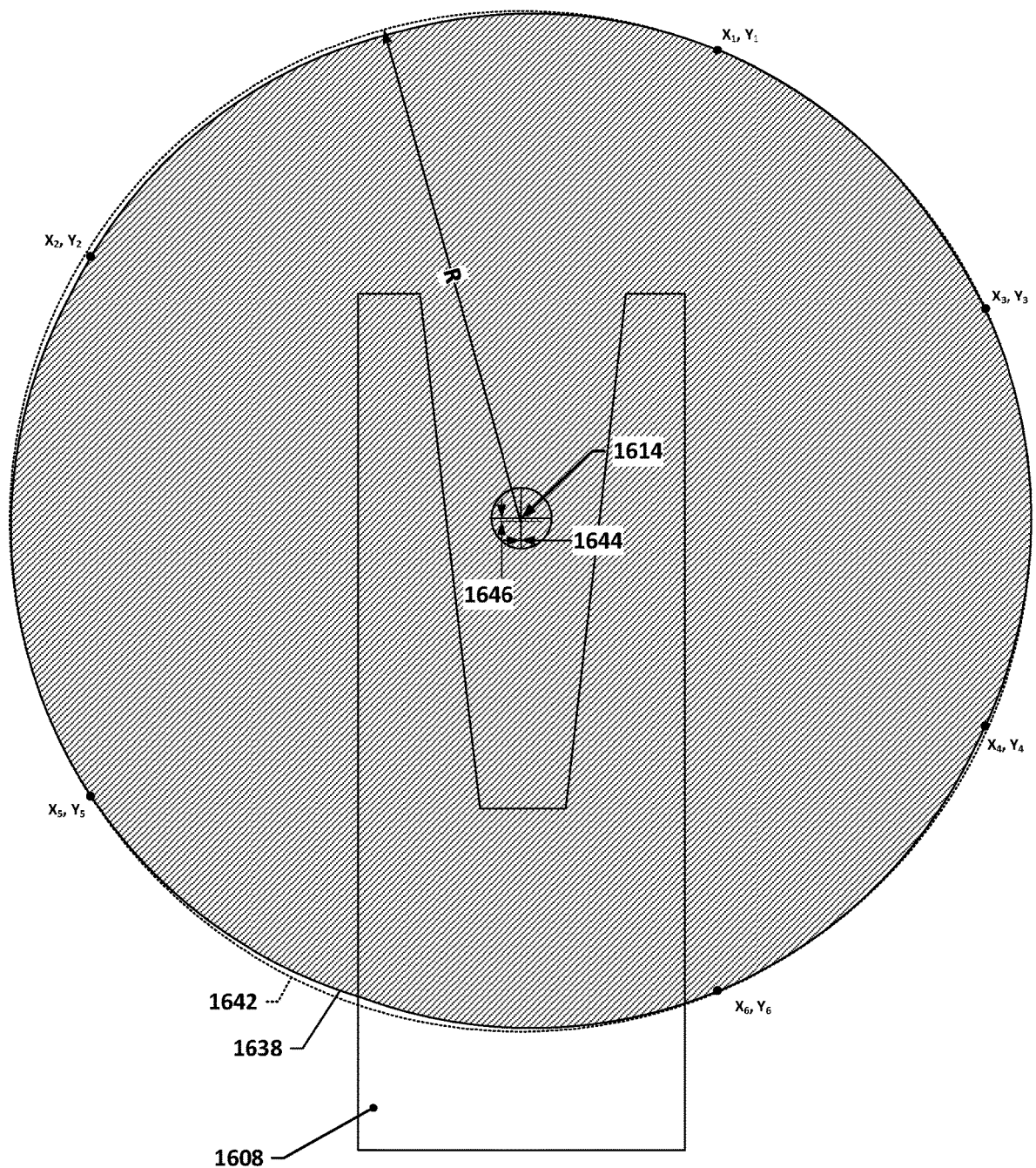
FIG. 16 depicts an example smallest circle for a multi-wafer silhouette edge.

FIG. 15 depicts Tables 1 and 2. Table 1 summarizes the (x, y) coordinate data for the above example; the coordinates of each intersection point relative to the nominal center point 1414 are listed. Table 2 lists all twenty possible triplet combinations of the six coordinates from Table 1. Tables 1 and 2 provide data in mm. Thus, for example, the fourth row of data in Table 2 is for coordinates 1 (60, 143.4), 2, (−132, 80.2), and 6 (60, −144.9). The first column indicates the relevant coordinate triplet for each row, the second through seventh columns list the XY coordinate data for that triplet, and eighth through tenth columns list the calculated center coordinates and radius of the circle that fits the coordinate triplet for each row. Finally, the last column indicates whether all six of the coordinates from Table 1 would be circumscribed by a circle with the parameters of each row. As can be seen, only four of the twenty coordinate triplets define a circle that circumscribes all of the coordinates from Table 1, although. Of these four, the sixth circle, i.e., that listed in the sixth row of data in Table 2, has the smallest value and would represent the smallest circle as discussed above. It will be understood that the circle diameter/center point location values listed in Table 2 have been rounded and may thus give the impression that the 1,3,5 triplet circle and the 3,5,6 triplet circle are the same size, i.e., that there are two smallest circles that contain all points, although in reality, only one of them is actually the smallest (in this case, the 1,3,5 triplet circle defines a radius of 156.402 mm, whereas the 3,5,6 triplet circle defines a radius of 156.428 mm). FIG. 16 depicts the example smallest circle discussed above graphically. In FIG. 16, the silhouette edge 1638 of the wafer stack is shown with diagonal hatching inside to allow it to be easily discerned from the smallest circle 1642 as defined by row six of Table 2 (FIG. 16 is not drawn at 1:1 scale relative to the dimensions listed in Tables 1 and 2, although it is drawn proportionately at about 55% scale). All six coordinates from Table 1 are shown. As can be seen, each coordinate lies either on the smallest circle 1642 (such as points 1, 3, and 5) or lies within the smallest circle 1642. It will be understood that while the present example uses six coordinate measurements, satisfactory accuracy may be obtained with smallest circle determinations made using a set of as few as five coordinate measurements (of course, more than six coordinate measurements may be used as well to further increase in accuracy).

Figure 17:
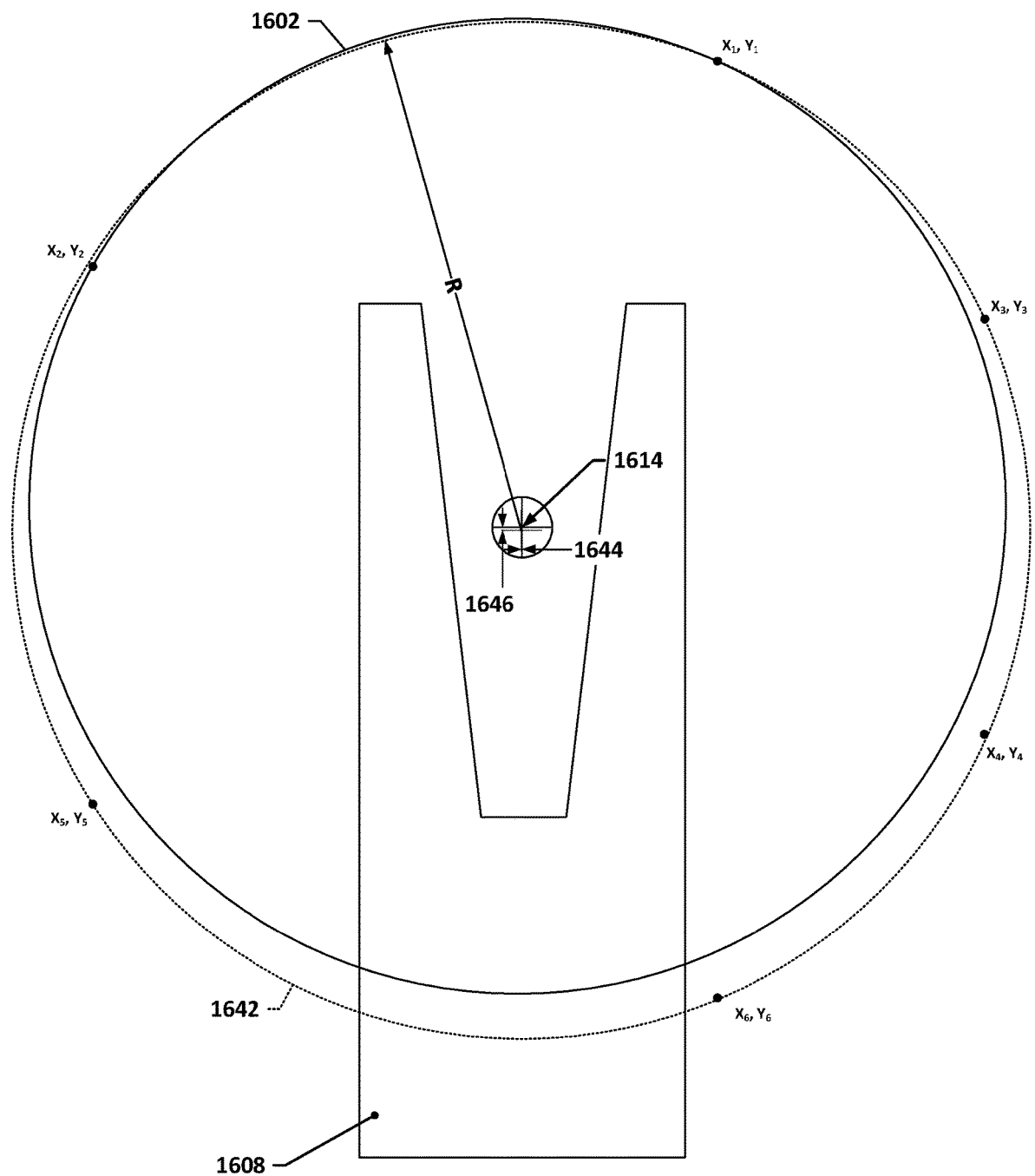
FIG. 17 depicts the smallest circle of FIG. 16, but with the silhouette edge removed.

The smallest circle thus acts as a proxy for a stack of wafers as a whole. It should be noted that the smallest circle is not 100% accurate, i.e., it is possible to define a smallest circle that circumscribes all measured coordinate points along a wafer stack silhouette edge and but that does not actually circumscribe the entire stack of wafers. FIG. 17 illustrates such an example. FIG. 17 depicts the smallest circle of FIG. 16, but with the silhouette edge 1638 removed. Additionally, a wafer 1602 has been added to the Figure— this wafer, as can be seen, has an outermost edge that intersects with coordinates $(x_1, y_1)$ and $(x_2, y_2)$. It is thus in a position that would not alter any of the coordinate measurements listed in Table 1. However, as can be observed, the outer perimeter of the wafer 1602 extends slightly past the smallest circle. This protrusion, however, is slight and can be accommodated through the use of an appropriate tolerance or threshold in later operations. In simulations, the maximum error in the combined slip amount (expressed in terms of smallest circle radius minus the nominal wafer radius) and center deviation (expressed in terms of displacement distance, regardless of direction) using triplets from six coordinate measurements resulted in about was about ±10% as compared with, for example, the same evaluation performed with one hundred coordinate measurements. Such error may be easily adjusted out by selecting threshold quantities that allow for such potential errors.

Once the smallest circle is determined in block 310, a determination may be made in block 312 as to what the slip amount is for the first set of one or more wafers. The slip amount is an indication of the magnitude of relative slip between the various wafers in the set of one or more wafers (in the case of a single wafer, of course, there will not be any relative slip since there is only one wafer; however, this parameter may still be calculated, if desired, to provide other information, e.g., an indication of how much the size of the wafer has changed due to thermal expansion or contraction). A slip amount of zero would be indicative that the wafers in the stack are in generally perfect alignment. Non-zero slip amounts would indicate that at least some wafers are not in alignment. Some amount of misalignment may, in some instances, be permissible depending on the placement requirements for a given station in a semiconductor processing tool, although there will typically be a threshold slip amount that, if exceeded, will generate an error condition or cause remedial action to be taken.

The slip amount may be a metric that is based on the differences in size between the nominal wafer diameter, e.g., 300 mm, and the diameter of the smallest circle. For example, the slip amount may be evaluated based on the difference in diameters between the nominal wafer diameter and the smallest circle diameter (or the difference in radii or the ratio between the two diameters or radii, if desired).

Another parameter that may be obtained once the smallest circle is determined, as indicated in block 314, is the center deviation, which refers to the deviation between the nominal center point of the end effector and the center point of the smallest circle. In FIGS. 16 and 17, the center deviation is defined by an X-offset 1644 (−0.2 mm in this example) and a Y-offset 1646 (−0.9 mm in this example).

One or both of the center deviation and the slip amount for a given wafer stack may be evaluated by the robot arm controller and then used to affect the handling of wafers. For example, in block 316, a determination may be made as to whether the slip amount is greater than a predetermined threshold amount. Such an amount, for example, may be pre-selected based on the specifications of the piece of equipment equipped with the enhanced AWC system. For example, a buffer station may require that all 300 mm wafers deposited in it fit within a cylindrical limit region envelope of 305 mm. In actual practice, such a requirement may be evaluated by checking several predetermined locations around the cylindrical limit region envelope to see if any wafers intersect with such locations. For example, a buffer station may have three, four, or more vertically oriented through-beam optical sensors (separate from the through-beam optical sensors used in the enhanced AWC system; for clarity, reference may be made herein to "first through-beam optical sensors" that are part of the enhanced AWC system and "second through-beam optical sensors" which may be used as protrusion sensors in a wafer receptacle), such as protrusion sensors 440 from FIG. 4, that are placed at different locations along a circular perimeter that is at least larger than the wafer diameters of the wafers that the buffer station is intended to hold (although it will be understood that the protrusion sensors need not necessarily be laid out along a circular perimeter—other perimeter shapes may be used, and the limit region envelope does not even need to be a cylindrical shape—other shapes may be used as well, as appropriate). If a wafer intersects with the optical beam of any of these through-beam optical sensors, then it may trigger a fault condition. While it may be feasible to then attempt to maneuver the wafer stack within the station such that none of the optical beams of the through-beam optical sensors intersects with a wafer, if the slip amount is too great, then it will not be possible to move the stack as a whole to achieve such a goal (short of removing it entirely). By using the slip amount and an appropriately set threshold, a determination may be made as soon as wafer stack measurement with the enhanced AWC system is complete as to whether or not the wafer stack can be placed within such a station without causing a fault condition.

If the slip amount is less than the threshold, i.e., it is possible to locate the wafer stack within the station and stay within acceptable operational tolerances, then the technique may proceed to block 318, in which a wafer centering correction may be made. For example, the wafer handling robot 418 may be controlled so as to move the nominal center point 414 to the target location for the nominal center point 414 at the station associated with the enhanced AWC system, e.g., the center of the first wafer receptacle 430A in this example. If there is center deviation, then the wafer handling robot 418 may be controlled to adjust the placement of the wafer by an amount that would effectively cancel out the center deviation, e.g., adjust the placement of the wafer relative to the target destination by the X- and Y-offsets discussed earlier. Such adjustment would cause the target location in the first wafer receptacle 430A to be aligned with the center of the smallest circle for the stack 404 of wafers 402 instead of the nominal center point 414 of the end effector. As a result, the stack 404 of wafers 402 would generally be centered within the cylindrical envelope discussed earlier, thus reducing the chance that a wafer might be detected as having strayed beyond the bounds of the cylindrical envelope.

Once the stack 404 of wafers 402 has been adjusted to center the smallest circle on the target point in the first wafer receptacle 430A, then the wafer handling robot 418 may be caused, in block 320, to lower the stack 404 of wafers 402 down onto the support shelves 432 without causing further XY translation. In block 322, the wafer transfer operation may be completed and the wafer handling robot 418 may then proceed to perform other operations, as needed.

Figure 6:
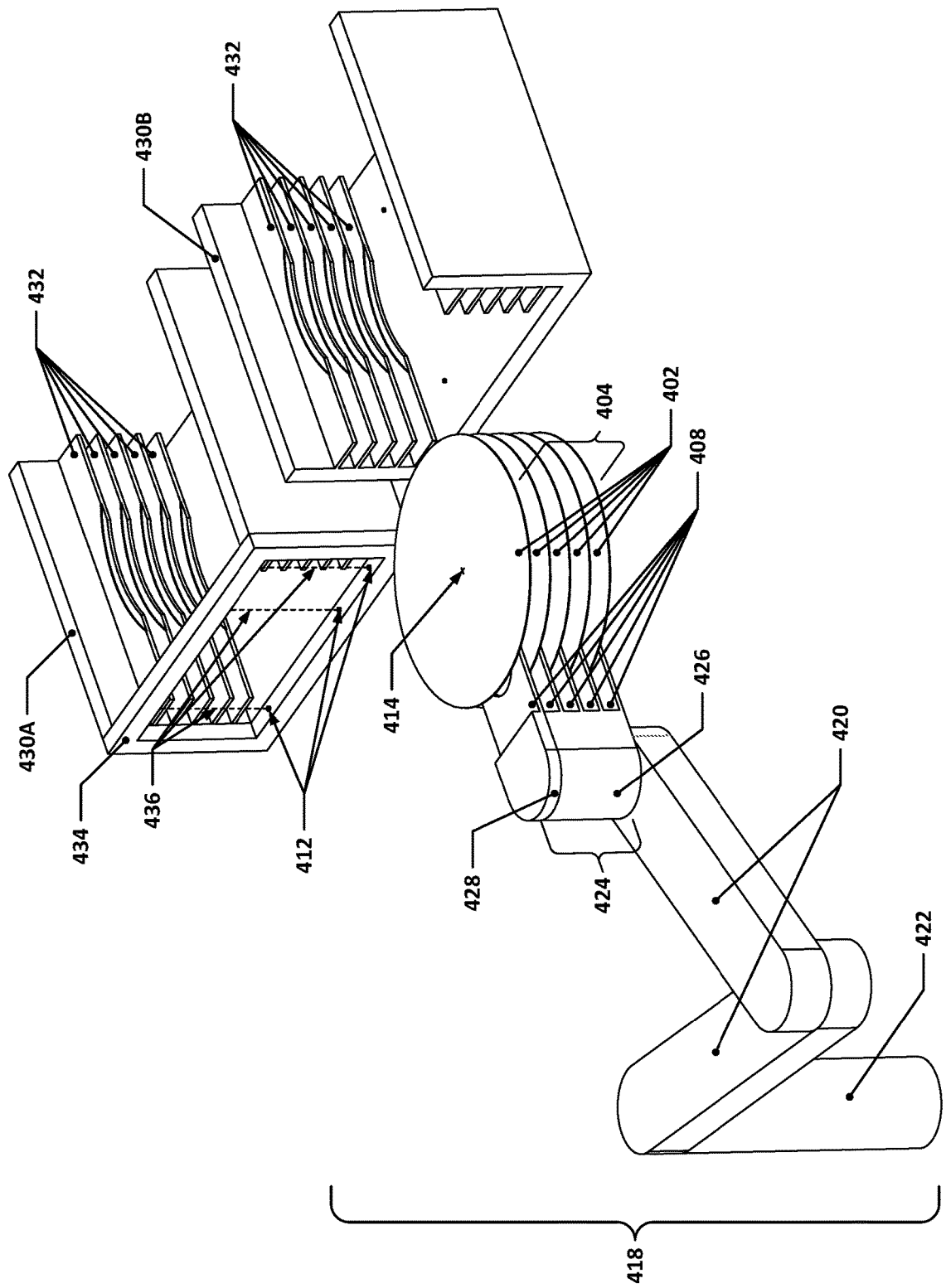
Figure 7:
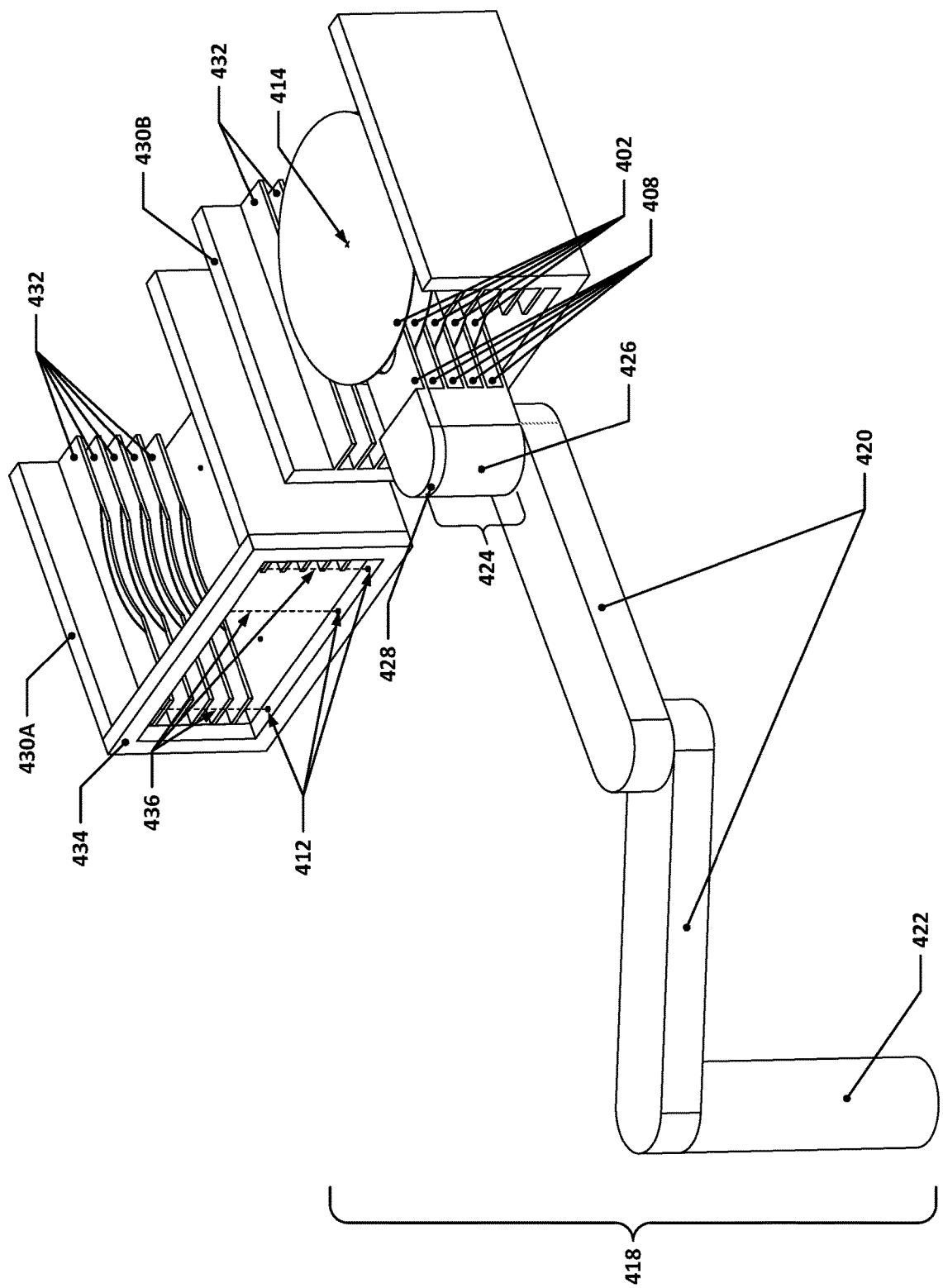

If the slip amount is determined in block 316 to be larger than the threshold amount, then the technique may proceed to block 324, in which the wafers may be withdrawn from the first wafer receptacle 430A and placed in a temporary storage location, e.g., into a FOUP, a buffer, or some other receptacle configured to support the wafers while the wafer handling robot 418 transfers the wafers 402 individually to the first wafer receptacle 430A during a second time period after the first time period. In this example, the temporary storage location is the second wafer receptacle 430B. While wafer receptacles 430A and 430E are shown as generally structurally identical here, it will be understood that the wafer receptacles 430A and 430B maybe structurally and/or functionally different in actual practice. FIG. 6 depicts the wafer handling robot 418 and wafers 402 after the wafers 402 have been withdrawn from the first wafer receptacle 430A and just prior to the insertion of the wafers 402 into the second wafer receptacle 430B. In FIG. 7, the wafer handling robot 418 has placed the wafers 402 into the second wafer receptacle 430B.

In block 326, the wafer handling robot 418 may be caused to retrieve a single wafer of the first set of one or more wafers from the second wafer receptacle 4308. In order to do so, it may be necessary, in some implementations, to reconfigure the end effector 424 of the wafer handling robot 418 (or to use a different robot arm with an end effector configured to pick up only one wafer at a time). In this example, the end effector 424 has, as discussed earlier, two portions: a single end effector 428 and a stack end effector 426. The single end effector 428 may include only a single blade 408 and be configured to only lift a single wafer 402 at a time. The stack end effector 426 may include N-1 blades, where N is the number of wafers in the first set of one or more wafers. In this example, there are five wafers 402 in the first set of one or more wafers 402, so N=5 and there are 5−1=4 blades 408 that are part of the stack end effector 426. The single end effector 428 and the stack end effector 426 may be movable relative to one another, e.g., the stack end effector 426 may be rotated such that the blades 408 of the stack end effector 426 can be caused to not engage with wafers 402 in the first set of one or more wafers 402 when the single end effector 428 is used to retrieve a wafer 402 in the first set of one or more wafers 402.

Figure 8:
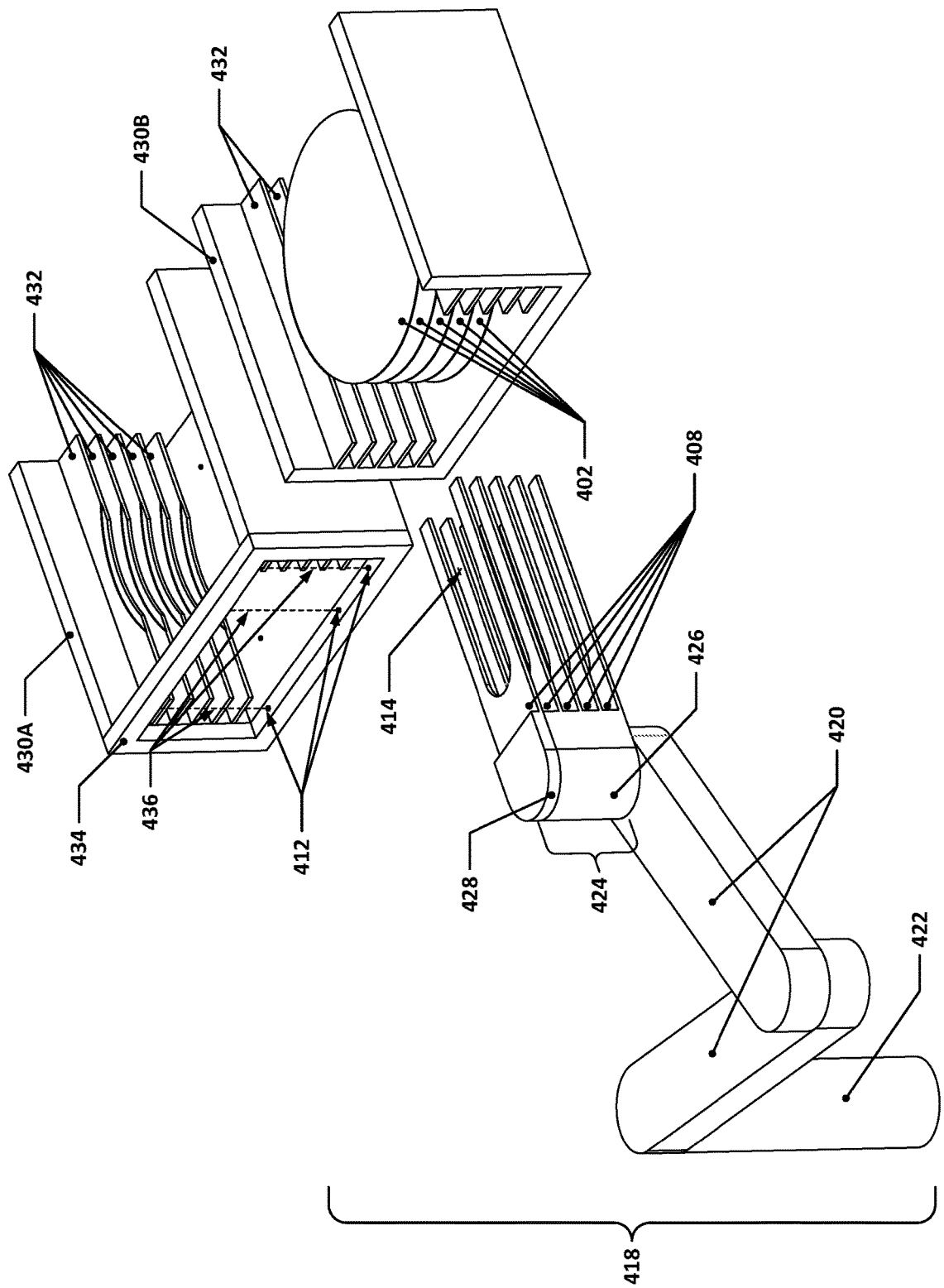
Figure 9:
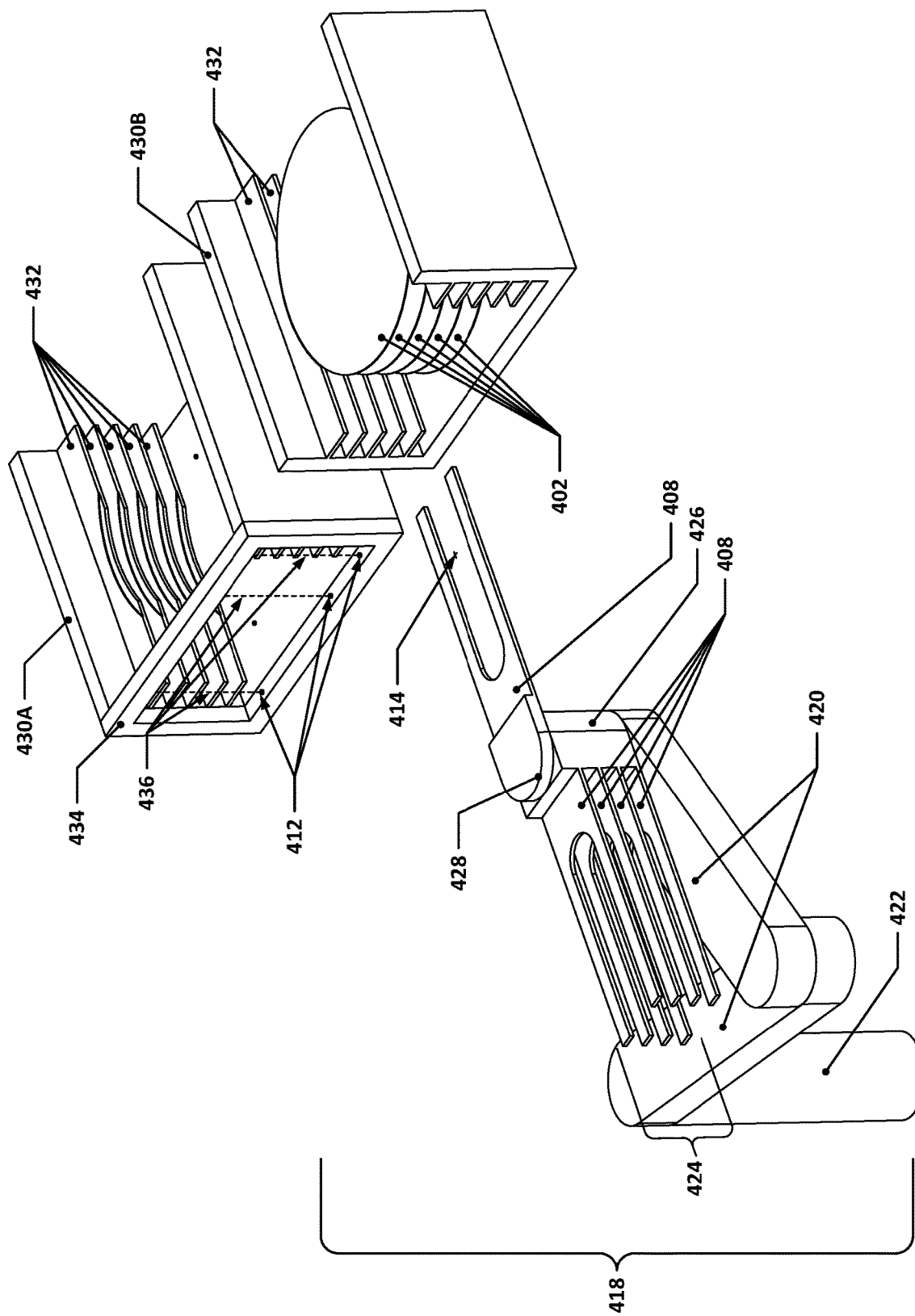

This is shown in FIGS. 8 and 9. In FIG. 8, the wafer handling robot 418 has been caused to withdraw from the second wafer receptacle 430B, leaving the wafers 402 temporarily placed in the second wafer receptacle 430B. Once clear of the second wafer receptacle 430B, the stack end effector 426 may be caused to rotate to the position shown relative to the single end effector 428, e.g., 180° out-of-phase, as shown in FIG. 9. Other mechanisms and techniques for getting the stack end effector 426 out of the way of the single end effector 428 may be used as well or in place of the depicted implementation.

Figure 10:
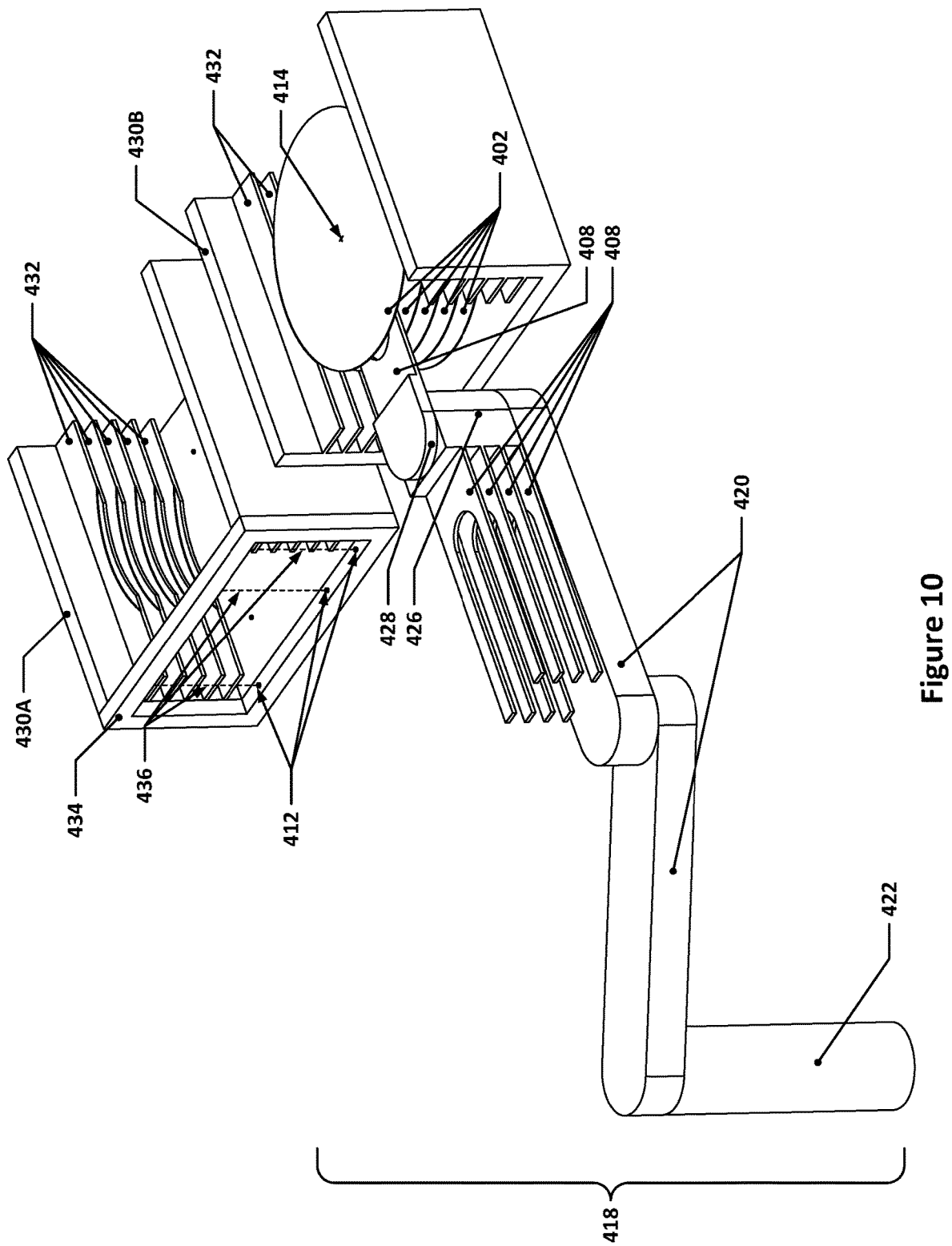
Figure 11:
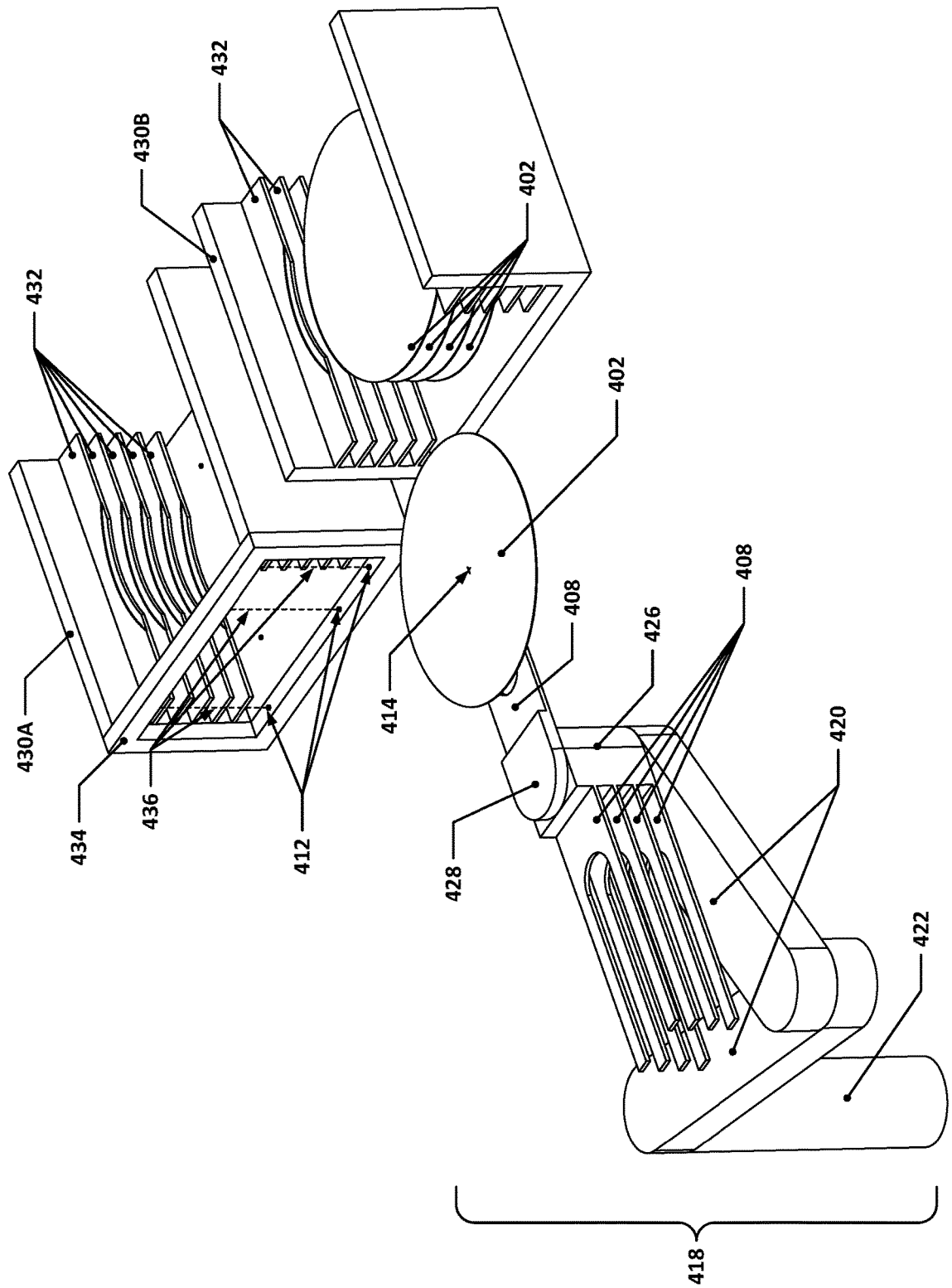
Figure 12:
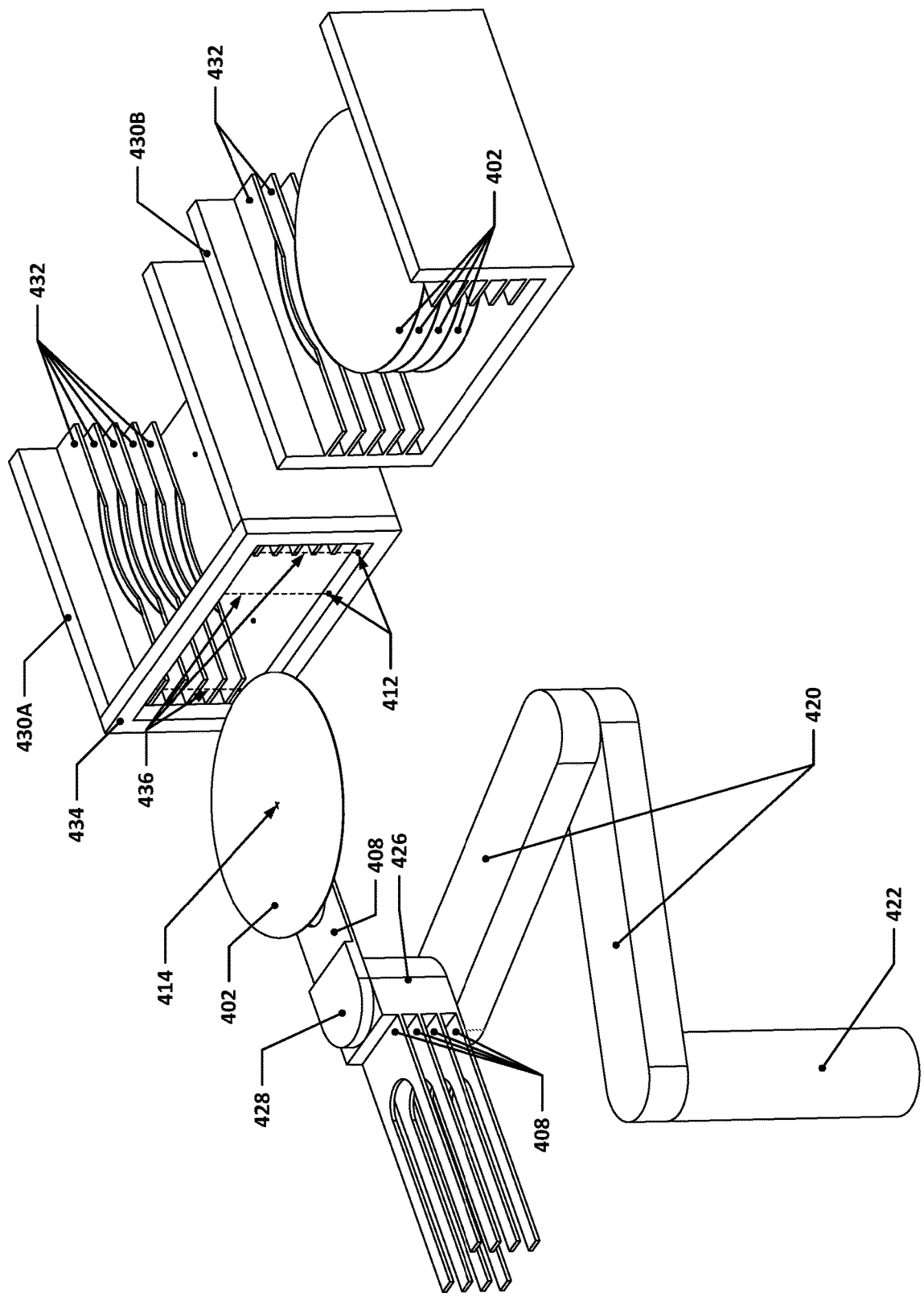
Figure 13:
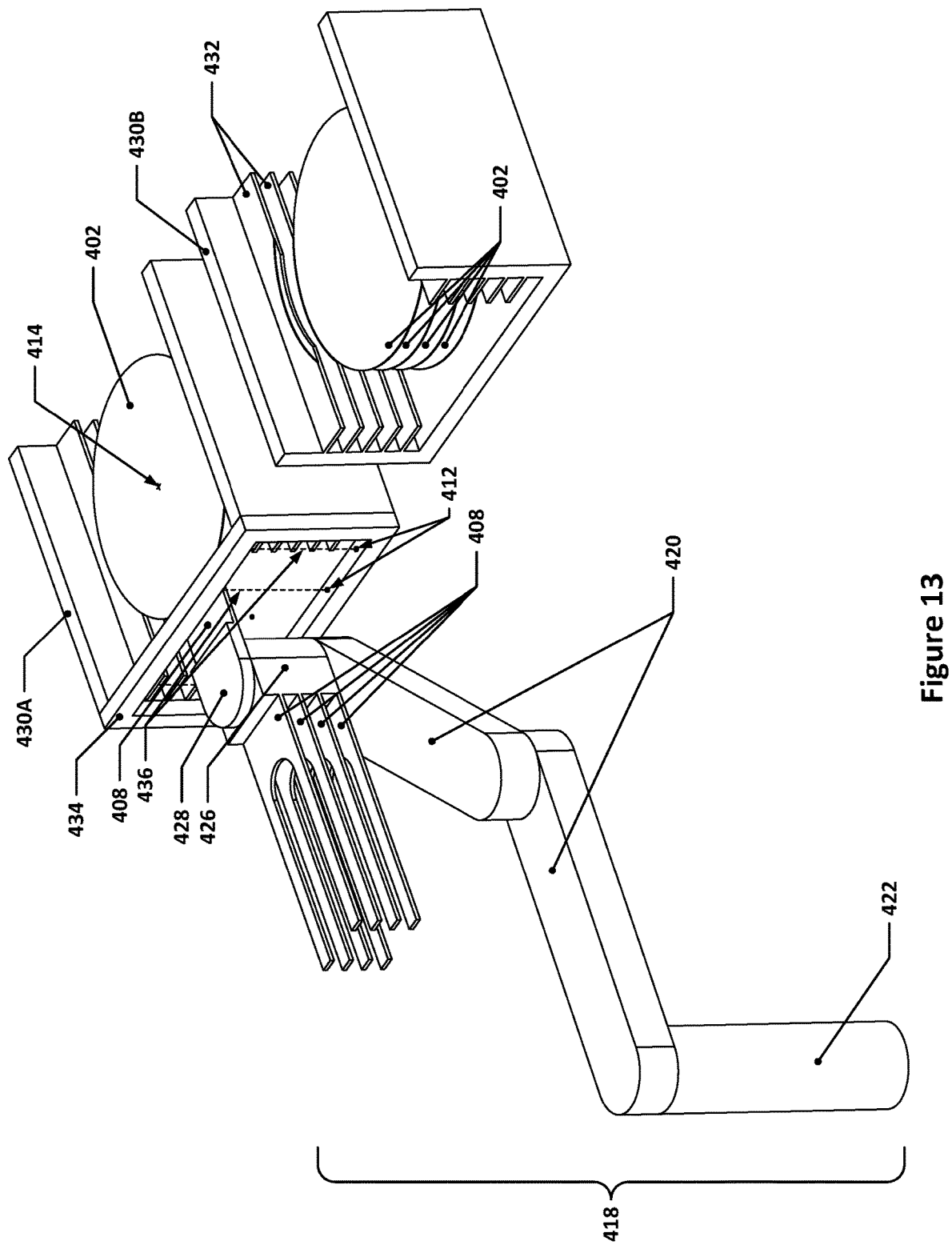

Once the wafer handling robot 418 is reconfigured for single-wafer retrieval/handling, the wafer handling robot may be controlled in block 326 so as to retrieve a single wafer 402, as shown in FIGS. 10 and 11, before proceeding to block 328 where the wafer handling robot 418 may be controlled to cause the single wafer 402 to be returned to the first wafer receptacle 430A and passed through the enhanced AWC system 434 again, as shown in FIGS. 12 and 13. During the transition between the positions shown in FIGS. 12 and 13, the through-beam optical sensors 412 may be used to obtain indications of when the edge of the wafer 402 intersects with the optical beams 436 emitted by the through-beam optical sensors 412. The XY coordinates of the nominal center point 414 at each such intersection may be determined in block 330 and used, along with the XY locations of the through-beam optical sensors 412, to determine the locations of the edge intersection points relative to the nominal center point. This process is similar to the previous XY determinations made to determine the smallest circle. While the same number of coordinates may be determined as were determined for the smallest circle determination, since there is only a single wafer present, the technique may also be performed with as few as two through-beam optical sensors 412. Since there is only a single wafer present, there is no need to determine slip amount, although the smallest circle technique may nonetheless be performed if desired so as to more accurately locate the center of the wafer 402, e.g., if the wafer diameter is other than the expected wafer diameter (due to thermal effects, for example).

Once the edge locations of the wafer 402 relative to the nominal center point 414 have been determined, a determination may be made in block 332 of the location of the center of the wafer 402 relative to the nominal center point 414 of the end effector. Such a determination, as mentioned above, may be made using the techniques discussed earlier with respect to the smallest circle determination. If desired, a simpler technique may be used in which it is assumed that the wafer 402 is of the proper diameter and any three of the relative coordinates can be used to determine a circle that is assumed to be representative of the wafer and centered on the wafer 402. The X- and Y-offsets between the calculated wafer center and the nominal center point 414 may be used to determine the center deviation of the single wafer 402, and then, when the wafer 402 is placed in the first wafer receptacle 430A, used to adjust the placement of the wafer 402 such that the center of the wafer 402 is aligned with the target location in the first wafer receptacle 430A.

In block 336, a determination may be made if further wafers of the first set of one or more wafers remain in the second wafer receptacle 430B. If so, then the technique may return to block 326 and the process may be repeated until all of the wafers in the first set of one or more wafers have been transferred to the first wafer receptacle 430A. Since the wafers 402 are all individually transferred to the first wafer receptacle 420A, this provides the opportunity to correct the placement of each wafer 402 independently, allowing inter-wafer displacements in the stack of wafers to be eliminated (or at least greatly reduced). However, the one-by-one transfer of the wafers will take significantly longer than a bulk transfer of multiple wafers simultaneously.

Once it has been determined that all of the wafers 402 in the first set of one or more wafers 402 have been transferred to the first wafer receptacle 430A, then the technique may proceed to block 338, at which point the wafer handling robot may be used to perform other operations.

As noted above, in some implementations, a controller may be included as part of the above-described systems or may be used to cause some or all of the above techniques to be performed. Such systems may include semiconductor processing equipment, including a processing tool or tools, chamber or chambers, a platform or platforms for processing, and/or specific processing components (a wafer pedestal, a gas flow system, etc.) and other items not specifically discussed herein. These systems may be integrated with electronics for controlling their operation before, during, and after processing of a semiconductor wafer or substrate. These electronics may be referred to as a "controller" which may control various components or subparts of the system or systems. The controller, depending on the processing requirements and/or the type of system, may be programmed to cause any of the techniques disclosed herein to be performed, including, for example, controlling a wafer handling robot to perform wafer transfer operations in accord with the concepts discussed herein, scanning of wafers by enhanced AWC systems, and then potentially causing subsequent corrective actions to be taken, e.g., individual placement of wafers into a wafer receptacle and/or re-centering of placed wafers prior to placement of the wafers.

Broadly speaking, the controller may be defined as electronics having various integrated circuits, logic, memory, and/or software that receive instructions, issue instructions, control operation of various operably connected pieces of equipment, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular wafer handling process for a semiconductor wafer. The operational parameters may, in some embodiments, include aspects such as nominal wafer size, robot arm parameters, placement envelopes, etc.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing system. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations, e.g., parameters governing wafer transfer operations. It should be understood that the parameters may be specific to the type of wafer transfer process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits in a semiconductor processing tool in communication with one or more integrated circuits located remotely (such as at the platform level or as part of a remote computer) that combine to control a wafer handling process.

Without limitation, example semiconductor processing tools having enhanced AWC systems and wafer handling robots as described herein may include additional components such as one or more plasma etch chambers or modules, deposition chambers or modules, spin-rinse chambers or modules, metal plating chambers or modules, clean chambers or modules, bevel edge etch chambers or modules, physical vapor deposition (PVD) chambers or modules, chemical vapor deposition (CUD) chambers or modules, atomic layer deposition (ALD) chambers or modules, atomic layer etch (ALE) chambers or modules, ion implantation chambers or modules, track chambers or modules, or any other semiconductor processing systems that may be associated or used in the fabrication and/or manufacturing of semiconductor wafers.

Depending on the process step or steps to be performed by the tool, the controller may communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The phrase "for each <item> of the one or more <items>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

It is to be further understood that the term "stack" or "stacked arrangement," as used herein, is not only inclusive of arrangements of multiple items, but also of a single item. Thus, for example, a "stack of one or more items" would be inclusive of a single such item (a "stack" of one) as well as a stack of multiple instances of such an item. Similarly, "one or more items placed in a stacked arrangement" would be inclusive of a single item as well as a plurality of such items stacked, for example, one on top of another. It is to be further understood that reference to "one or more items" is generally inclusive of both the singular case, e.g., reference to use of a single such item, or the plural case, e.g., reference to a plurality of such items.

The term "optical beam" is used herein to refer to light that may be emitted from a light source or emitter; a light source may emit multiple optical beams simultaneously in different directions, e.g., an omnidirectional light source may emit optical beams in all or almost all directions simultaneously. In such a light source, the optical beams that are generally emitted upwards and downwards may be characterized as being vertically oriented optical beams, whereas the optical beams that are emitted horizontally may be characterized as being horizontally oriented optical beams. For light emitters or sources that emit collimated light, there may be only a limited number of optical beams emitted—however, the vast majority of the light energy that is released for such emitters or light sources may be concentrated in a single optical beam (or a cluster of optical beams that are generally all within a very limited angular range, e.g., such as may be the case for lasers or similar light sources. Thus, a laser that emits a beam along a vertical axis and an omnidirectional light that emits at least some light along a vertical axis would both be described as emitting vertically oriented optical beams.

The term "wafer," as used herein, may refer to semiconductor wafers or substrates or other similar types of wafers or substrates.

It is also to be understood that the use of ordinal indicators, e.g., (a), (b), (c), . . . , herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed (b) since (b) relies on information obtained in (a)-(c), however, could be performed before or after either of (a) or (b).

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus for handling a plurality of wafers having nominal diameters $D_1$, the apparatus comprising:
 a wafer handling robot configured to support the plurality of wafers when the plurality of wafers $D_1$ are placed thereupon;
 a first edge-detection system; and
 a controller that includes one or more processors and one or more memory devices, wherein:

the one or more processors, the one or more memory devices, the wafer handling robot, and the first edge-detection system are operably connected with each other, and the one or more memory devices store computer-executable instructions for controlling the one or more processors to:
- a) obtain information regarding a first reference point of the wafer handling robot;
- b) determine that a plurality of wafers is supported by the wafer handling robot, the plurality of wafers defining a silhouette edge in a horizontal plane when viewed along a vertical axis;
- c) cause the first edge-detection system to obtain information indicative of first horizontal coordinates of at least five points along the silhouette edge of the plurality of wafers relative to the first reference point;
- d) determine, for the plurality of wafers, a smallest circle that, when viewed along a vertical axis, circumscribes the first horizontal coordinates of the at least five points determined in (c);
- e) determine, for the plurality of wafers, a first center deviation by determining information indicative of the length and direction of a first reference line segment extending from the center of the smallest circle for the plurality of wafers to the first reference point; and
- f) determine whether the first center deviation for the plurality of wafers is indicative of a wafer alignment error condition.

2. The apparatus of claim 1, wherein the first edge-detection system includes three first through-beam optical sensors, wherein each first through-beam optical sensor is:
configured to emit a corresponding vertically oriented optical beam when activated,
positioned such that the furthest horizontal distance between any of the optical beams, when the first through-beam optical sensors are activated, is less than $D_1$, and
configured to register, when the first through-beam optical sensor is activated, when the optical beam emitted thereby intersects an edge of an object.

3. The apparatus of claim 1, wherein the first edge-detection system includes a machine-vision system and the machine-vision system is configured to obtain the information indicative of the first horizontal coordinates of the at least five points along the silhouette edge of the plurality of wafers relative to the first reference point.

4. The apparatus of claim 1, wherein the first edge-detection system includes one or more items selected from the group consisting of: a set of three or more direct through-beam optical sensors, a set of three or more reflective through-beam optical sensors, a machine vision measurement system, and a set of three or more capacitive sensors.

5. The apparatus of claim 1, wherein:
the wafer handling robot includes an end effector having N blades,
the plurality of wafers includes N or fewer wafers,
each blade is configured to support one of the wafers, and N is greater than or equal to the number of wafers in the plurality of wafers.

6. The apparatus of claim 5, wherein:
the N blades include a first set of N-1 blades that are fixed with respect to one another,
the first set of N-1 blades are configured to move as a unit relative to a portion of the wafer handling robot to which the first set of N-1 blades are attached, and
the blade of the end effector that is not in the first set of N-1 blades is configured to be movable relative to the portion of the wafer handling robot to which the first set of N-1 blades are attached independently of the first set of N-1 blades.

7. The apparatus of claim 6, wherein N=5.

8. The apparatus of claim 1, further comprising:
a first wafer receptacle including a plurality of first wafer supports configured to receive the plurality of wafers, wherein the first wafer supports are each configured to support a wafer placed thereupon and within a limit region envelope associated with the first wafer receptacle and having a minimum horizontal dimension of $D_2$, wherein $D_2$ is greater than $D_1$ by at least a first threshold amount.

9. The apparatus of claim 8, wherein the one or more memory devices further store computer-executable instructions for further controlling the one or more processors to:
- g) determine a first slip amount for the plurality of wafers that is based on the difference between the diameter of the smallest circle and $D_1$;
- h) cause the wafer handling robot to place the wafers in the plurality of wafers into a second wafer receptacle responsive, at least in part, to a determination that the first slip amount for the plurality of wafers is more than the first threshold amount; and
- i) cause, after (h) and during a second time period, the wafer handling robot to, for each wafer in the plurality of wafers:
retrieve the wafer from the second wafer receptacle,
cause the first edge-detection system, while the wafer is supported by the wafer handling robot, to obtain information indicative of at least three second horizontal coordinates along the silhouette edge of the wafer relative to the first reference point,
determine an estimated center point of the wafer relative to the first reference point using the at least three second horizontal coordinates,
determine a second center deviation by determining information indicative of the length and direction of a second reference line segment extending from the estimated center point of the wafer to the first reference point,
determine a second wafer offset for the wafer based on the information indicative of the length and orientation of the second reference line segment for the wafer, and
cause the wafer handling robot to operate, during one or more operations where the wafer is supported by the wafer handling robot, to place the wafer into the first wafer receptacle in accordance with the second wafer offset.

10. The apparatus of claim 8, wherein the first wafer receptacle further includes a second edge-detection system configured to register, when the second edge-detection system is activated, when an edge of an object intersects one or more second horizontal locations monitored by that second edge-detection system.

11. The apparatus of claim 8, wherein the one or more memory devices further store computer-executable instructions for further controlling the one or more processors to:
- g) determine a first slip amount for the plurality of wafers that is based on the difference between the diameter of the smallest circle and $D_1$; and h) cause the wafer handling robot to place at least some of the wafers in the plurality of wafers into the first wafer receptacle responsive, at least in part, to a determination that the first slip amount for the plurality of wafers is less than the first threshold amount.

12. The apparatus of claim 11, wherein the one or more memory devices further store computer-executable instructions for further controlling the one or more processors to:
i) determine a first wafer offset for the plurality of wafers based on the information indicative of the length and orientation of the first reference line segment for the plurality of wafers; and
j) cause the wafer handling robot to operate, during one or more operations where the plurality of wafers is supported by the wafer handling robot, to place the at least some of the wafers in the plurality of wafers into the first wafer receptacle in accordance with the first wafer offset.

13. A method for handling a plurality of wafers having nominal diameters $D_1$, the method comprising:
a) retrieving the plurality of wafers using a wafer handling robot configured to support the plurality of wafers when the plurality of wafers is placed thereupon, the plurality of wafers defining a silhouette edge in a horizontal plane when viewed along a vertical axis;
b) obtaining information regarding a first reference point of the wafer handling robot using a first edge-detection system;
c) obtaining information indicative of first horizontal coordinates of at least five points along the silhouette edge of the plurality of wafers relative to the first reference point using the first edge-detection system;
d) determining, for the plurality of wafers, a smallest circle that, when viewed along a vertical axis, circumscribes the first horizontal coordinates of the at least five points determined in (c);
e) determining, for the plurality of wafers, a first center deviation by determining information indicative of the length and direction of a first reference line segment extending from the center of the smallest circle for the plurality of wafers to the first reference point; and
f) determining whether the first center deviation for the plurality of wafers is indicative of a wafer alignment error condition.

14. The method of claim 13, wherein the first edge-detection system includes one or more items selected from the group consisting of: a set of three or more direct through-beam optical sensors, a set of three or more reflective through-beam optical sensors, a machine vision measurement system, and a set of three or more capacitive sensors.

15. The method of claim 13, wherein:
the first edge-detection system includes three first through-beam optical sensors;
each first through-beam optical sensor is:
configured to emit a corresponding vertically oriented optical beam when activated,
positioned such that the furthest horizontal distance between any of the optical beams, when the first through-beam optical sensors are activated, is less than $D_1$, and
configured to register, when the first through-beam optical sensor is activated, when the optical beam emitted thereby intersects an edge of an object; and
c) is performed by obtaining horizontal coordinates for each instance where the silhouette edge of the plurality of wafers intersects one of the optical beams emitted by one of the first through-beam optical sensors.

16. The method of claim 13, wherein:
the first edge-detection system includes a machine-vision system and the machine-vision system is configured to obtain the information indicative of the first horizontal coordinates of the at least five points along the silhouette edge of the plurality of wafers relative to the first reference point; and
c) is performed using the machine-vision system to obtain the horizontal coordinates of the at least five points.

17. The method of claim 13, wherein:
the wafer handling robot includes an end effector having N blades,
the plurality of wafers includes N or fewer wafers,
each blade is configured to support one of the wafers, and
N is greater than or equal to the number of wafers in the plurality of wafers.

18. The method of claim 17, wherein:
the N blades include a first set of N-1 blades that are fixed with respect to one another,
the first set of N-1 blades are configured to move as a unit relative to a portion of the wafer handling robot to which the first set of N-1 blades are attached, and
the blade of the end effector that is not in the first set of N-1 blades is configured to be movable relative to the portion of the wafer handling robot to which the first set of N-1 blades are attached independently of the first set of N-1 blades.

19. The method of claim 18, wherein N=5.

20. The method of claim 13, further comprising:
g) determining a first slip amount for the plurality of wafers that is based on the difference between the diameter of the smallest circle and $D_1$; and
h) determining that $D_1$ is less than $D_2$ by at least a first threshold amount, wherein:
$D_2$ is the minimum horizontal dimension of a limit region envelope associated with a first wafer receptacle including a plurality of first wafer supports configured to receive the plurality of wafers, and
the first wafer supports are each configured to support a wafer placed thereupon and within the limit region envelope.

21. The method of claim 20, further comprising:
determining that the first slip amount for the plurality of wafers is less than the first threshold amount, and
causing the wafer handling robot to place at least some of the wafers in the plurality of wafers into the first wafer receptacle responsive, at least in part, to the determination that the first slip amount for the plurality of wafers is less than the first threshold amount.

22. The method of claim 21, further comprising:
determining a first wafer offset for the plurality of wafers based on the information indicative of the length and orientation of the first reference line segment for the plurality of wafers; and
causing the wafer handling robot to operate, during one or more operations where the plurality of wafers is supported by the wafer handling robot, to place the at least some of the wafers in the plurality of wafers into the first wafer receptacle in accordance with the first wafer offset.

23. The method of claim 20, wherein the first wafer receptacle further includes a second edge-detection system configured to register, when the second edge-detection system is activated, when an edge of an object intersects one or more second horizontal locations monitored by that second edge-detection system.

24. The method of claim 20, further comprising:
i) causing the wafer handling robot to place the wafers in the plurality of wafers into a second wafer receptacle responsive, at least in part, to a determination that the first slip amount for the plurality of wafers is more than the first threshold amount; and
j) causing, after (i) and during a second time period, the wafer handling robot to, for each wafer in the plurality of wafers:
retrieve the wafer from the second wafer receptacle,
cause the first edge-detection system, while the wafer is supported by the wafer handling robot, to obtain information indicative of at least three second horizontal coordinates along the silhouette edge of the wafer relative to the first reference point,
determine an estimated center point of the wafer relative to the first reference point using the at least three second horizontal coordinates,
determine a second center deviation by determining information indicative of the length and direction of a second reference line segment extending from the estimated center point of the wafer to the first reference point,
determine a second wafer offset for the wafer based on the information indicative of the length and orientation of the second reference line segment for the wafer, and
cause the wafer handling robot to operate, during one or more operations where the wafer is supported by the wafer handling robot, to place the wafer into the first wafer receptacle in accordance with the second wafer offset.

25. A non-transitory, computer-readable medium storing computer-executable instructions thereon for controlling one or more processors to:
a) cause a plurality of wafers having nominal diameters $D_1$ to be retrieved using a wafer handling robot configured to support the plurality of wafers when the plurality of wafers is placed thereupon, the plurality of wafers defining a silhouette edge in a horizontal plane when viewed along a vertical axis;
b) obtain information regarding a first reference point of the wafer handling robot using a first edge-detection system;
c) obtain information indicative of first horizontal coordinates of at least five points along the silhouette edge of the plurality of wafers relative to the first reference point using the first edge-detection system;
d) determine, for the plurality of wafers, a smallest circle that, when viewed along a vertical axis, circumscribes the first horizontal coordinates of the at least five points determined in (c);
e) determine, for the plurality of wafers, a first center deviation by determining information indicative of the length and direction of a first reference line segment extending from the center of the smallest circle for the plurality of wafers to the first reference point; and
f) determine whether the first center deviation for the plurality of wafers is indicative of a wafer misalignment condition.

26. The non-transitory, computer-readable medium of claim 25, wherein:
the first edge-detection system includes a machine-vision system and the machine-vision system is configured to obtain the information indicative of the first horizontal coordinates of the at least five points along the silhouette edge of the plurality of wafers relative to the first reference point; and
the non-transitory, computer-readable medium further stores instructions for controlling the one or more processors to interface with the machine-vision system and to cause the horizontal coordinates of (c) to be obtained using the machine-vision system.

27. The non-transitory, computer-readable medium of claim 25, wherein the first edge-detection system includes, and the non-transitory, computer-readable medium further stores instructions for causing the one or more processors to interface and communicate with, one or more items selected from the group consisting of: a set of three or more direct through-beam optical sensors, a set of three or more reflective through-beam optical sensors, a machine vision measurement system, and a set of three or more capacitive sensors.

28. The non-transitory, computer-readable medium of claim 25, wherein:
the first edge-detection system includes three first through-beam optical sensors;
each first through-beam optical sensor is:
configured to emit a corresponding vertically oriented optical beam when activated,
positioned such that the furthest horizontal distance between any of the optical beams, when the first through-beam optical sensors are activated, is less than $D_1$, and
configured to register, when the first through-beam optical sensor is activated, when the optical beam emitted thereby intersects an edge of an object; and
the non-transitory, computer-readable medium further stores instructions for controlling the one or more processors to operate the three first through-beam optical sensors to cause the horizontal coordinates of (c) to be obtained for each instance where the silhouette edge of the plurality of wafers intersects one of the optical beams emitted by one of the first through-beam optical sensors.

29. The non-transitory, computer-readable medium of claim 25, where the non-transitory computer-readable medium further stores instructions for causing the one or more processors to:
g) determine a first slip amount for the plurality of wafers that is based on the difference between the diameter of the smallest circle and $D_1$; and
h) determine whether $D_1$ is less than $D_2$ by at least a first threshold amount, wherein:
$D_2$ is the minimum horizontal dimension of a limit region envelope associated with a first wafer receptacle including a plurality of first wafer supports configured to receive the plurality of wafers, and
the first wafer supports are each configured to support a wafer placed thereupon and within the limit region envelope.

30. The non-transitory, computer-readable medium of claim 29, wherein the non-transitory, computer-readable medium further stores instructions for controlling the one or more processors to:
determine, in (g), that the first slip amount for the plurality of wafers is less than the first threshold amount, and
cause the wafer handling robot to place at least some of the wafers in the plurality of wafers into the first wafer receptacle responsive, at least in part, to the determination that the first slip amount for the plurality of wafers is less than the first threshold amount.

31. The non-transitory, computer-readable medium of claim 30, wherein the non-transitory, computer-readable medium further stores instructions for controlling the one or more processors to:
  i) determine a first wafer offset for the plurality of wafers based on the information indicative of the length and orientation of the first reference line segment for the plurality of wafers; and
  j) cause the wafer handling robot to operate, during one or more operations where the plurality of wafers is supported by the wafer handling robot, to place the at least some of the wafers in the plurality of wafers into the first wafer receptacle in accordance with the first wafer offset.

32. The non-transitory, computer-readable medium of claim 29, wherein the non-transitory, computer-readable medium further stores instructions for controlling the one or more processors to:
  i) cause the wafer handling robot to place the wafers in the plurality of wafers into a second wafer receptacle responsive, at least in part, to a determination that the first slip amount for the plurality of wafers is more than the first threshold amount; and
  j) cause, after (i) and during a second time period, the wafer handling robot to, for each wafer in the plurality of wafers:
    retrieve the wafer from the second wafer receptacle,
    cause the first edge-detection system, while the wafer is supported by the wafer handling robot, to obtain information indicative of at least three second horizontal coordinates along the silhouette edge of the wafer relative to the first reference point,
    determine an estimated center point of the wafer relative to the first reference point using the at least three second horizontal coordinates,
    determine a second center deviation by determining information indicative of the length and direction of a second reference line segment extending from the estimated center point of the wafer to the first reference point,
    determine a second wafer offset for the wafer based on the information indicative of the length and orientation of the second reference line segment for the wafer, and
    cause the wafer handling robot to operate, during one or more operations where the wafer is supported by the wafer handling robot, to place the wafer into the first wafer receptacle in accordance with the second wafer offset.

* * * * *